(12) United States Patent
Yamada et al.

(10) Patent No.: US 9,887,138 B2
(45) Date of Patent: Feb. 6, 2018

(54) SEMICONDUCTOR DEVICE

(71) Applicant: PANASONIC CORPORATION, Kadoma-shi, Osaka (JP)

(72) Inventors: Takayuki Yamada, Toyama (JP); Hideyuki Arai, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 913 days.

(21) Appl. No.: 13/629,037

(22) Filed: Sep. 27, 2012

(65) Prior Publication Data

US 2013/0020654 A1    Jan. 24, 2013

Related U.S. Application Data

(63) Continuation of application No. PCT/JP2010/006198, filed on Oct. 19, 2010.

(30) Foreign Application Priority Data

May 24, 2010 (JP) .................................. 2010-118035

(51) Int. Cl.
*H01L 21/70* (2006.01)
*H01L 29/66* (2006.01)
(Continued)

(52) U.S. Cl.
CPC ........... *H01L 21/823857* (2013.01); *H01L 21/82385* (2013.01); *H01L 21/823842* (2013.01);
(Continued)

(58) Field of Classification Search
CPC ............................................. H01L 21/823842
(Continued)

(56) References Cited

U.S. PATENT DOCUMENTS 6,638,844 B1* 10/2003 Verma ............... H01L 21/76224
257/516
7,663,176 B2* 2/2010 Sakai ............... H01L 21/823842
257/314
(Continued)

FOREIGN PATENT DOCUMENTS

JP    2009-105340 A    5/2009
JP    2009-105340 A    5/2009
(Continued)

OTHER PUBLICATIONS

International Search Report issued in International Patent Application No. PCT/JP2010/006198 dated Jan. 25, 2011.

*Primary Examiner* — Dale E. Page
*Assistant Examiner* — Wilner Jean Baptiste
(74) *Attorney, Agent, or Firm* — McDermott Will & Emery LLP

(57) ABSTRACT

A semiconductor device includes first and second MIS transistors and a dummy element. The first MIS transistor includes a first gate insulating film which includes a first high-k insulating film formed on a first active region and contains an adjusting metal. The second MIS transistor includes a second gate insulating film which includes a second high-k insulating film formed on a second active region and is free of the adjusting metal. The dummy element includes a dummy gate insulating film which includes a dummy high-k insulating film formed on a dummy active region and at least a portion of which is free of the adjusting metal. The first active region is formed in a second conductivity type first well region. The second active region is formed in a first conductivity type second well region. The dummy active region is formed in a second conductivity type third well region.

15 Claims, 12 Drawing Sheets

(51) Int. Cl.
*H01L 21/8238* (2006.01)
*H01L 27/02* (2006.01)
*H01L 21/66* (2006.01)

(52) U.S. Cl.
CPC .......... *H01L 22/34* (2013.01); *H01L 27/0207* (2013.01); *H01L 2924/0002* (2013.01)

(58) Field of Classification Search
USPC ........................................................ 257/369
See application file for complete search history.

(56) References Cited

U.S. PATENT DOCUMENTS

| | | | |
|---|---|---|---|
| 2002/0061608 A1* | 5/2002 | Kuroda et al. ................. | 438/129 |
| 2003/0098473 A1 | 5/2003 | Matsuda et al. | |
| 2006/0170065 A1* | 8/2006 | Nakanishi et al. ............ | 257/392 |
| 2006/0273401 A1* | 12/2006 | Tsujikawa et al. ............ | 257/369 |
| 2007/0131930 A1* | 6/2007 | Aida ............... H01L 21/823437 | 257/48 |
| 2007/0138557 A1* | 6/2007 | Ipposhi .................. H01L 21/84 | 257/347 |
| 2008/0096383 A1 | 4/2008 | Tigelaar et al. | |
| 2008/0191286 A1* | 8/2008 | Chang ............... H01L 21/82345 | 257/369 |
| 2009/0108356 A1* | 4/2009 | Cheng ................. H01L 29/4966 | 257/365 |
| 2009/0212371 A1 | 8/2009 | Kobayashi | |
| 2009/0309165 A1 | 12/2009 | Ogawa et al. | |
| 2010/0133623 A1* | 6/2010 | Inumiya .......... H01L 21/823857 | 257/369 |
| 2010/0148280 A1* | 6/2010 | Mitsuhashi ....... H01L 21/28185 | 257/410 |
| 2010/0279496 A1* | 11/2010 | Kadoshima et al. ......... | 438/585 |
| 2010/0327366 A1* | 12/2010 | Manabe .......... H01L 21/823842 | 257/369 |
| 2013/0126927 A1* | 5/2013 | Iguchi .................... H01L 33/60 | 257/98 |

FOREIGN PATENT DOCUMENTS

| | | |
|---|---|---|
| JP | 2009-194352 A | 8/2009 |
| JP | 2010-10199 A | 1/2010 |
| JP | 2010-010199 A | 1/2010 |

* cited by examiner

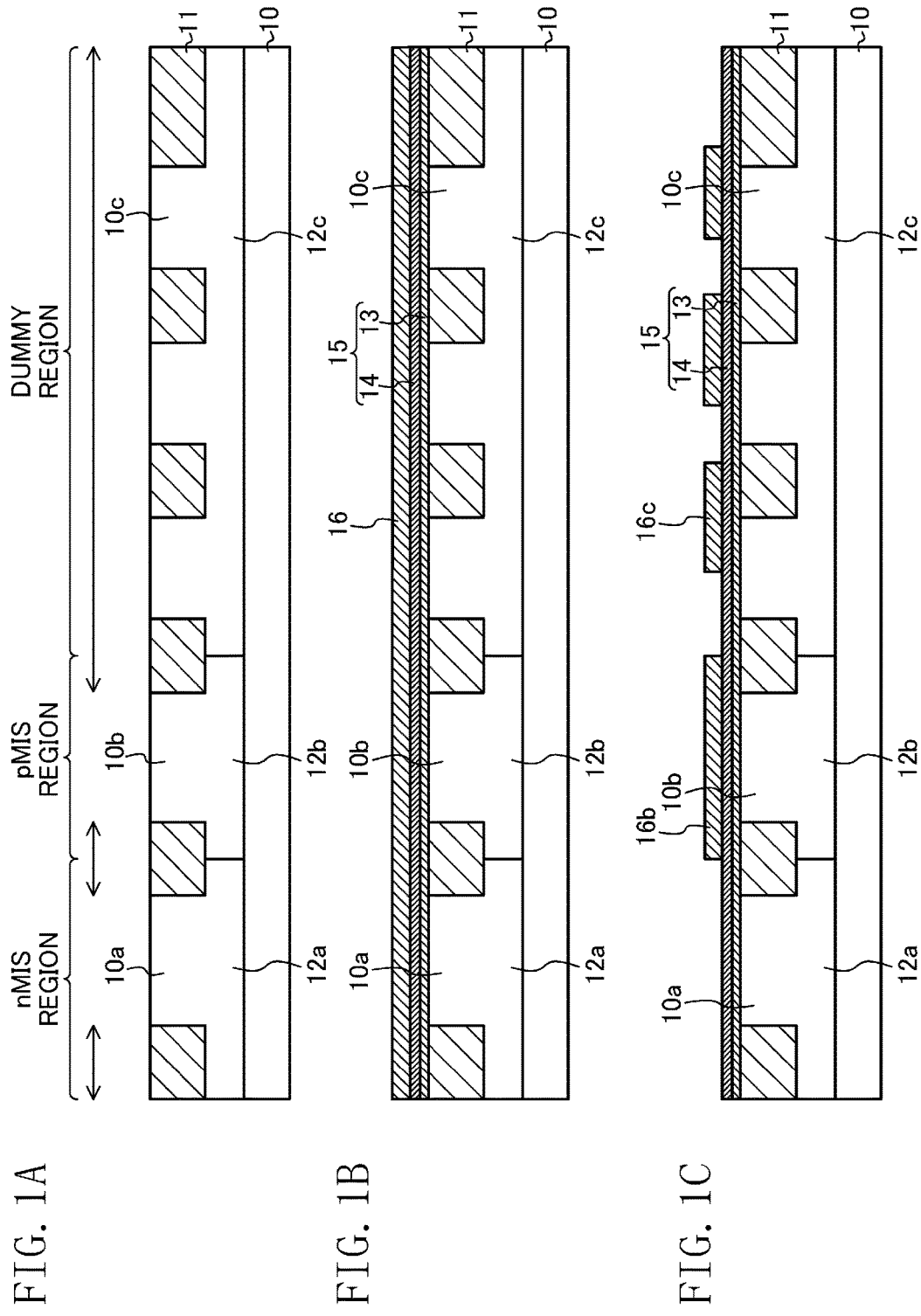

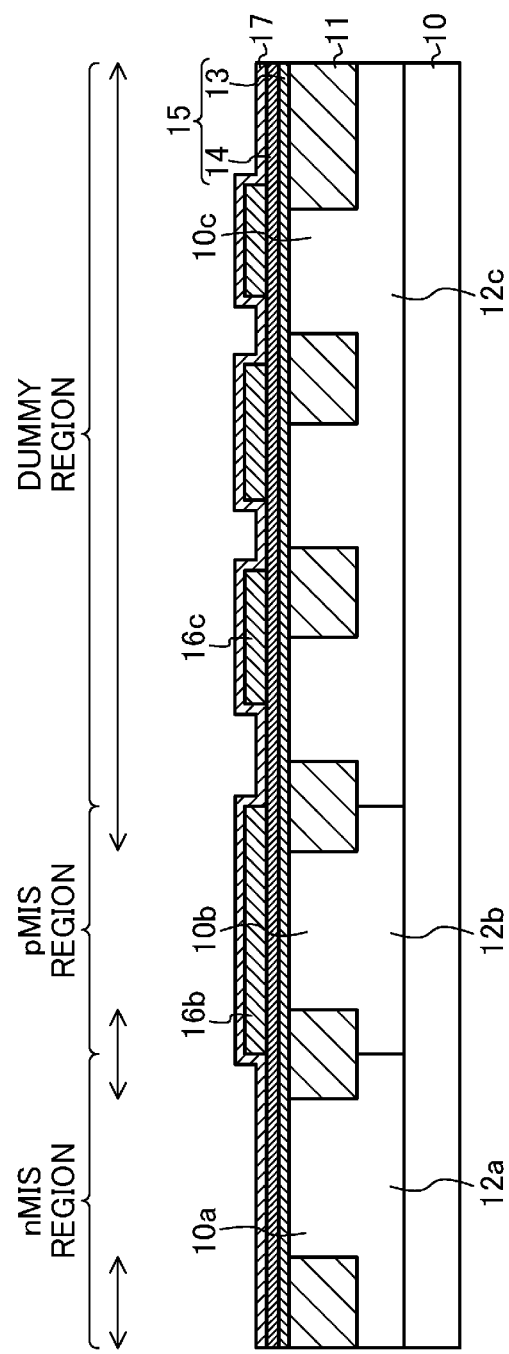
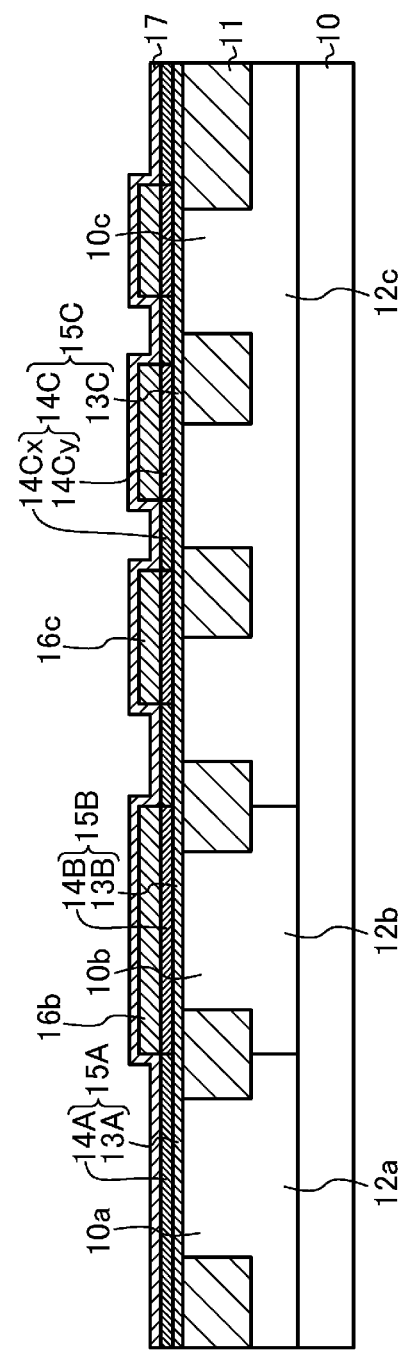
FIG. 2A
FIG. 2B

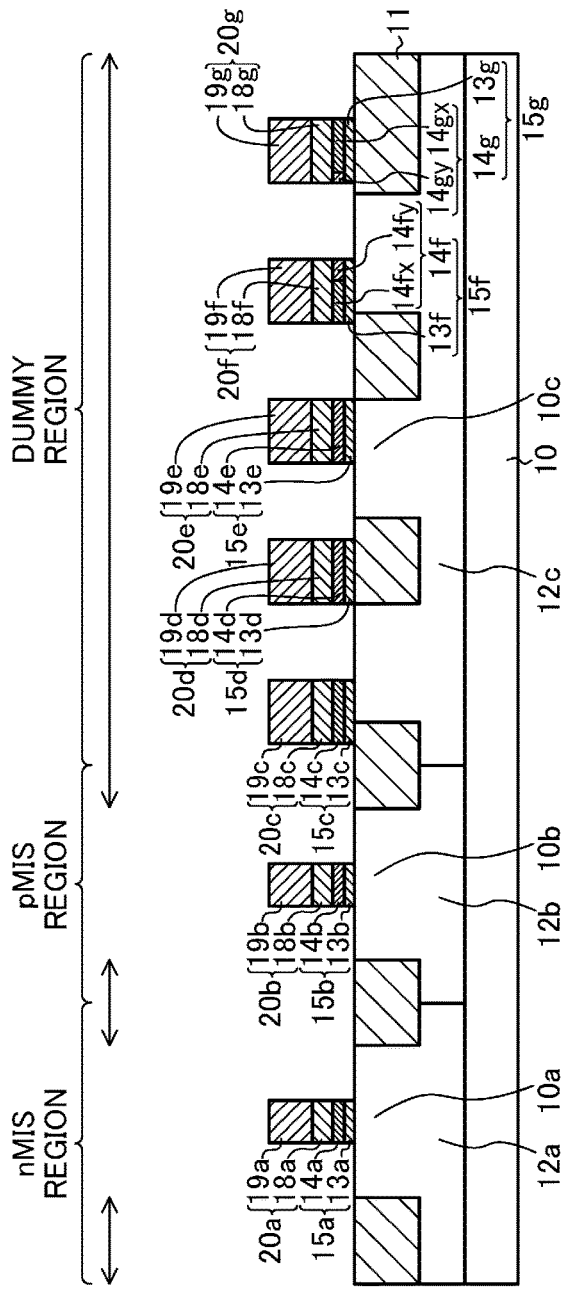
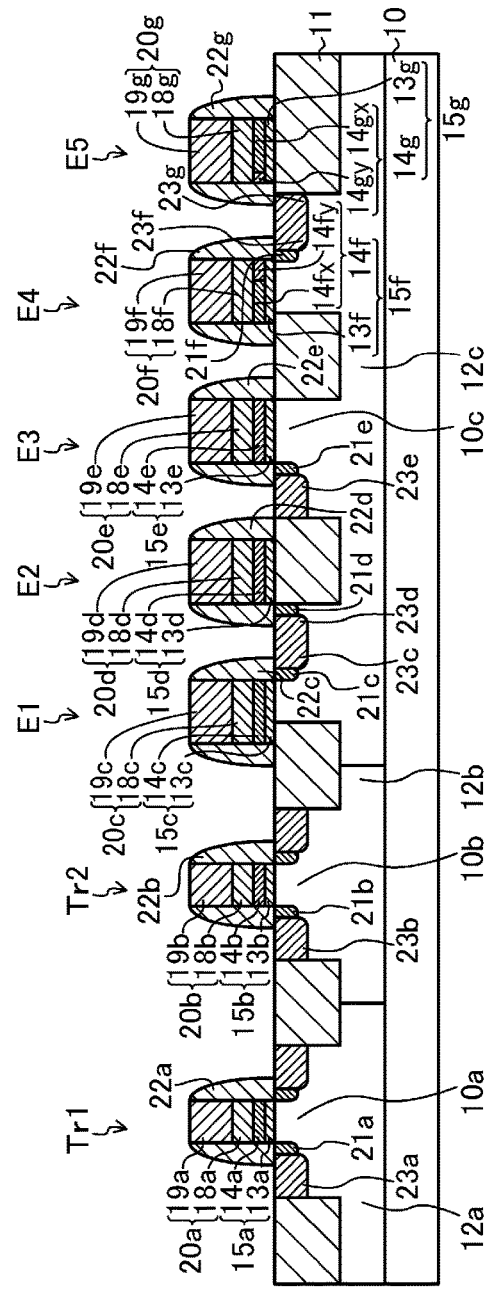
FIG. 4A
FIG. 4B

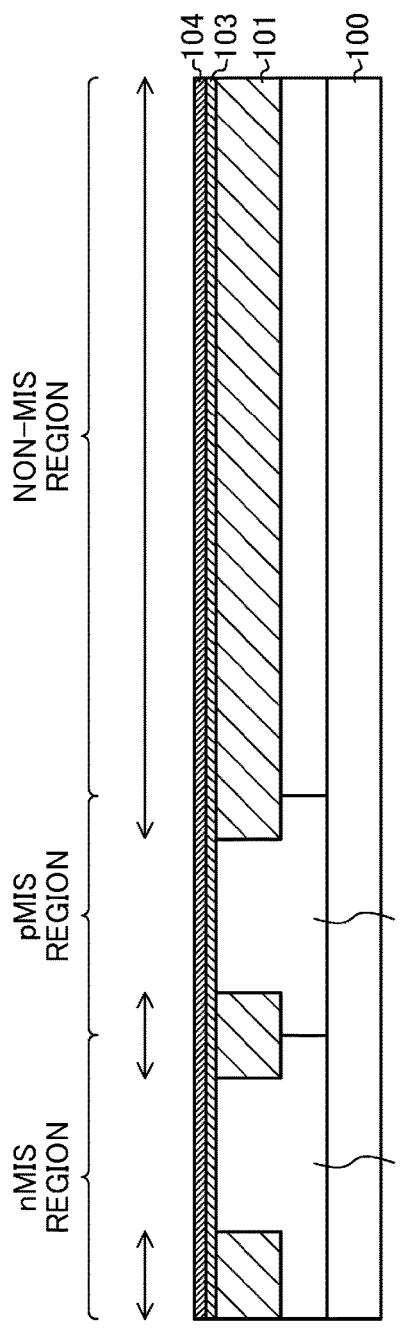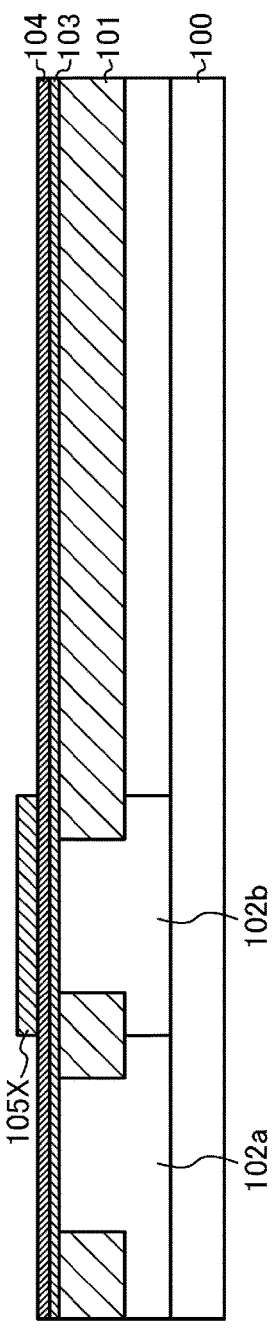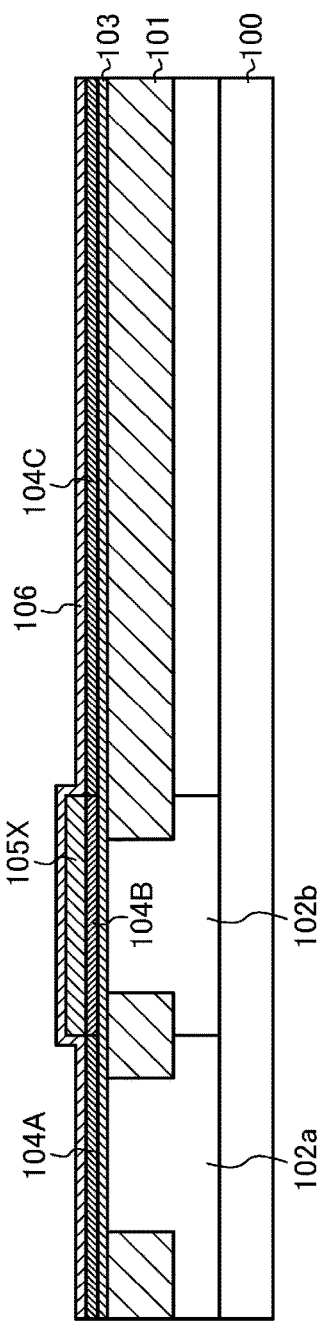
FIG. 10A
FIG. 10B
FIG. 10C

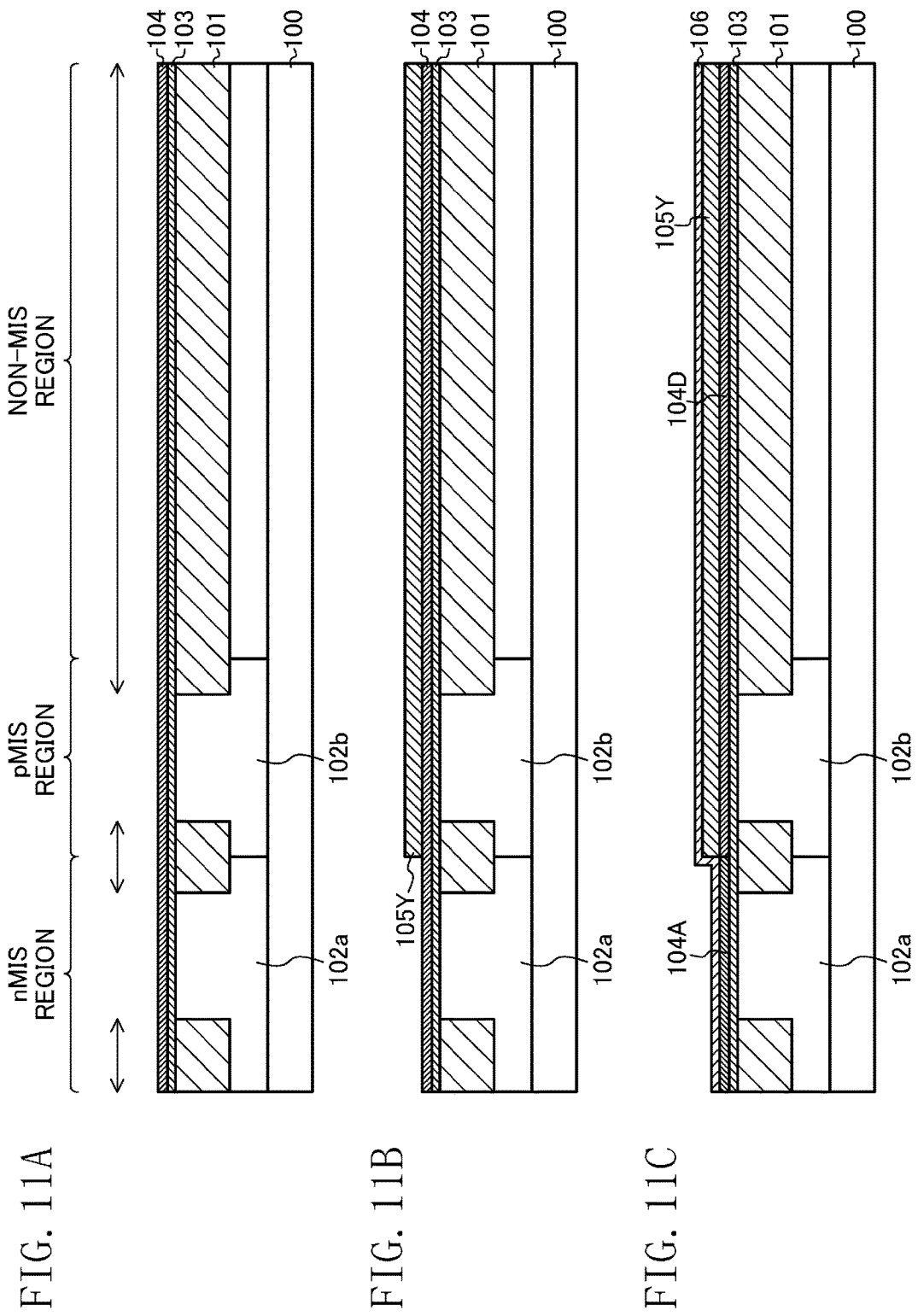

SEMICONDUCTOR DEVICE

CROSS-REFERENCE TO RELATED APPLICATION

This is a continuation of PCT International Application PCT/JP2010/006198 filed on Oct. 19, 2010, which claims priority to Japanese Patent Application No. 2010-118035 filed on May 24, 2010. The disclosures of these applications including the specifications, the drawings, and the claims are hereby incorporated by reference in their entirety.

BACKGROUND

The present disclosure relates to semiconductor devices and methods for fabricating the same, and specifically to a semiconductor device including a metal insulator semiconductor field effect transistor (MISFET) having a gate insulating film including a high dielectric constant insulating film (high-k insulating film) containing an adjusting metal and a method for fabricating the same.

In order to achieve increased speed and reduced power consumption which have been required for semiconductor integrated circuits in recent years, both increasing gate capacitance and reducing leakage currents are required. Thus, it has been attempted to use, as gate insulating films, high-k insulating films such as Hf-based oxide films containing hafnium (Hf) instead of conventional silicon oxide films to reduce the electrical thickness of the gate insulating films and to increase the physical thickness of the gate insulating films so that leakage currents are reduced with increased gate capacitance.

However, using the high-k insulating films as the gate insulating films causes a problem where a phenomenon called Fermi level pinning increases threshold voltages of MISFETs (hereinafter referred to as "MIS transistors"). Thus, using Hf-based oxide films containing, for example, lanthanum (La) as the gate insulating films has been considered to reduce threshold voltages of n-type MIS transistors. Note that using the Hf-based oxide films containing La as the gate insulating films can reduce the threshold voltages of the n-type MIS transistors based on the following reasons. When Hf-based oxide films contain La, flat band voltages are shifted in the negative direction, so that effective work functions of n-type MIS transistors are shifted to a band edge, which can reduce threshold voltages of the n-type MIS transistors.

Therefore, a method for fabricating a semiconductor device including an n-type metal oxide semiconductor (MOS) transistor using a Hf-based oxide film containing La as a gate insulating film and a p-type MOS transistor has been proposed (for example, see Patent Document 1: Japanese Patent Publication 2009-194352). A method for fabricating a conventional semiconductor device will be described below with reference to FIGS. 9A-9D. FIGS. 9A-9D are cross-sectional views illustrating process steps of the method for fabricating the conventional semiconductor device in the gate length direction in a sequential order. In FIGS. 9A-9D, the term "nMOS region" refers to a region in which an n-type MOS transistor is formed, and the term "pMOS region" refers to a region in which a p-type MOS transistor is formed.

First, as illustrated in FIG. 9A, $SiO_2$ films 202x, 202y are formed on active regions 200a, 200b surrounded by an element isolation region 201 in a semiconductor substrate 200. After that, a HfSiO film 203 and a Si film 204 are sequentially formed above the semiconductor substrate 200. After that, only portions of the Si film 204 and the HfSiO film 203 located in the pMOS region are nitrided, thereby forming a HfSiON film 205 and a SiN film 206. After that, a La(O) film 207 is formed on the Si film 204 and the SiN film 206.

Next, as illustrated in FIG. 9B, a W film 208 and a TiN film 209 are sequentially formed on the La(O) film 207.

Next, as illustrated in FIG. 9C, a thermal treatment is performed. Through the thermal treatment, La in the La(O) film 207 is diffused into the HfSiO film 203, thereby forming a HfSiO film 210 containing La. On the other hand, the SiN film 206 prevents La in the La(O) film 207 from being diffused into the HfSiON film 205. Additionally, reaction is caused between the Si film 204 and the W film 208, thereby forming a WSi film 211.

Next, as illustrated in FIG. 9D, a polycrystalline Si film is formed on the TiN film 209. After that, patterning is performed. Through the patterning, on the active region 200a, a gate insulating film 210A composed of a $SiO_2$ film 202a and a HfSiO film 210a containing La; and a gate electrode 212A composed of a WSi film 211a, a TiN film 209a, and a polycrystalline Si film 212a are sequentially formed. On the other hand, on the active region 200b, a gate insulating film 205B composed of a $SiO_2$ film 202b and a HfSiON film 205b; a SiN film 206b; a La(O) film 207b; and a gate electrode 212B composed of a W film 208b, a TiN film 209b, and a polycrystalline Si film 212b are sequentially formed.

The conventional semiconductor device is thus fabricated.

SUMMARY

However, the method for fabricating the conventional semiconductor device has the following problems.

Conventionally, as illustrated in FIG. 9C, in the thermal treatment, the SiN film 206 formed only on the HfSiON film 205 is used as an introduction prevention mask to prevent La in the La(O) film 207 from being introduced into the HfSiON film 205.

Generally, it is difficult to selectively remove SiN films from high-k insulating films (for example, HfSiON films). For this reason, conventionally, the SiN film 206 is not removed but remains on the HfSiON film 205 after the thermal treatment, so that as illustrated in FIG. 9D, the SiN film 206b exists between the gate insulating film 205B and the gate electrode 212B. This causes problems where gate capacitance is reduced, and drivability of a p-type MOS transistor is reduced.

Thus, it is preferable that after the thermal treatment, the introduction prevention mask be selectively removed from the high-k insulating film. Thus, using a metal mask containing a refractory metal as the introduction prevention mask is expected to be a promising technology. This allows the introduction prevention mask (metal mask) to be selectively removed from the high-k insulating film after the thermal treatment.

Examples of a method for selectively introducing an adjusting metal (e.g., La) for adjusting the threshold voltage of a MIS transistor into a portion of a high-k insulating film located in an nMIS region by using a metal mask containing a refractory metal as the introduction prevention mask may include first and second methods as described below. The first and second methods will be described with reference to FIGS. 10A-10C and FIGS. 11A-11C. FIGS. 10A-10C are cross-sectional views illustrating process steps of the first method for fabricating a semiconductor device in a sequential order. FIGS. 11A-11C are cross-sectional views illustrating process steps of the second method for fabricating a semiconductor device in a sequential order. In FIG. 10A through FIG. 11C, the term "nMIS region" refers to a region in which an n-type MIS transistor is formed. The term "pMIS region" refers to a region in which a p-type MIS transistor is formed. The term "non-MIS region" refers to a region in which neither an n-type MIS transistor nor a p-type MIS transistor is formed. A region indicated by arrows is an element isolation formation region, and the term "element isolation formation region" refers to a region including an element isolation region. In FIGS. 10A-10C and FIGS. 11A-11C, like reference numerals indicate the substantially same components. FIG. 10A through FIG. 11C are cross-sectional views illustrating a configuration of part of a chip included in a wafer. Note that a wafer W includes a plurality of chips C as illustrated in FIG. 12. The chips C are eventually separated from the wafer W as individual pieces. Although not shown in FIG. 12, for the sake of simplicity, each chip C includes a plurality of n-type and p-type MIS transistors.

The first method for fabricating a semiconductor device will be described below. Note that the following description describes processes to the step of removing the introduction prevention mask, and description of steps thereafter will be omitted.

First, as illustrated in FIG. 10A, an element isolation region 101 is formed in the element isolation formation region of a semiconductor substrate 100. After that, a p-type first well region 102a is formed in the nMIS region of the semiconductor substrate 100. On the other hand, an n-type second well region 102b is formed in the pMIS region of the semiconductor substrate 100. After that, an underlying film 103 and a high-k insulating film 104 are sequentially formed on the semiconductor substrate 100.

Next, as illustrated in FIG. 10B, a refractory metal film is formed on the high-k insulating film 104. After that, the refractory metal film is patterned so that a metal mask 105X is formed to expose portions of the high-k insulating film 104 located in the nMIS region and a non-MIS region and to cover a portion of the high-k insulating film 104 located in the pMIS region.

Next, as illustrated in FIG. 10C, an adjusting metal compound film 106 containing an adjusting metal is formed on the high-k insulating film 104 provided with the metal mask 105X. After that, by using the metal mask 105X as the introduction prevention mask, a thermal treatment such as rapid thermal annealing (RTA) using infrared rays is performed. Through the thermal treatment, the adjusting metal in the adjusting metal compound film 106 is introduced into the portions of the high-k insulating film 104 located in the nMIS region and the non-MIS region, thereby forming high-k insulating films 104A, 104C which contain the adjusting metal. On the other hand, the metal mask 105X prevents the adjusting metal in the adjusting metal compound film 106 from being introduced into the portion of the high-k insulating film 104 located in the pMIS region, thereby forming a high-k insulating film 104B which is free of the adjusting metal.

After that, unreacted portions of the adjusting metal compound film 106 and the metal mask 105X are removed. Here, the metal mask 105X can be selectively removed from the high-k insulating film 104B.

The second method for fabricating a semiconductor device will be described below. Note that the following description describes processes to the step of removing the introduction prevention mask, and description of steps thereafter will be omitted.

First, a process similar to that of FIG. 10A is performed, thereby forming a configuration illustrated in FIG. 11A.

Next, as illustrated in FIG. 11B, a refractory metal film is formed on the high-k insulating film 104. After that, the refractory metal film is patterned so that a metal mask 105Y is formed to expose a portion of the high-k insulating film 104 located in the nMIS region, and to cover portions of the high-k insulating film 104 located in the pMIS region and the non-MIS region.

Next, as illustrated in FIG. 11C, an adjusting metal compound film 106 is formed on the high-k insulating film 104 provided with the metal mask 105Y. After that, by using the metal mask 105Y as the introduction prevention mask, a thermal treatment such as RTA is performed. Through the thermal treatment, an adjusting metal in the adjusting metal compound film 106 is introduced into the portion of the high-k insulating film 104 located in the nMIS region, thereby forming a high-k insulating film 104A which contains the adjusting metal. On the other hand, the metal mask 105Y prevents the adjusting metal in the adjusting metal compound film 106 from being introduced into the portions of the high-k insulating film 104 located in the pMIS region and the non-MIS region, thereby forming a high-k insulating film 104D which is free of the adjusting metal.

After that, unreacted portions of the adjusting metal compound film 106 and the metal mask 105Y are removed. Here, the metal mask 105Y can be selectively removed from the high-k insulating film 104D.

As can be seen from the above description, the adjusting metal has to be introduced into a portion of the high-k insulating film 104 located above an active region 100a. On the other hand, the adjusting metal has to be prevented from being introduced into a portion of the high-k insulating film 104 located above an active region 100b. In contrast, the adjusting metal may be, but not necessarily, introduced into a portion of the high-k insulating film 104 located above the element isolation formation region.

However, the first and second methods for fabricating the semiconductor device have the following problems.

In the first method, as illustrated in FIG. 10C, the metal mask 105X covers only the portion of the high-k insulating film 104 located in the pMIS region. Thus, a region in which pMIS regions densely exist is a dense region in which metal masks 105X are densely provided. In contrast, a region in which pMIS regions sparsely exist is a sparse region in which metal masks 105X are sparsely provided.

On the other hand, in the second method, as illustrated in FIG. 11C, the metal mask 105Y exposes only a portion of the high-k insulating film 104 located in the nMIS region. Thus, a region in which nMIS regions densely exist is a sparse region in which metal masks 105Y are sparsely provided. In contrast, a region in which nMIS regions sparsely exist is a dense region in which metal masks 105Y are densely provided.

Thus, in the first method, the area ratio of the metal masks varies in accordance with the density of the pMIS regions in a chip. In contrast, in the second method, the area ratio of the metal masks varies in accordance with the density of the nMIS regions in a chip. The term "density of the n, pMIS regions in a chip (density level)" refers to a proportion of the surface area of nMIS regions to the surface area of a chip or a proportion of pMIS regions to the surface area of a chip. The term "area ratio of the metal masks" refers to a proportion of the surface area of metal masks to the surface area of a chip. As described above, the area ratio of the metal masks varies in accordance with the density of the nMIS regions or the pMIS regions in the chip.

Generally, there are variations in density of the n, pMIS regions in the chip. Therefore, as illustrated in FIG. 12, when the chip C is divided into, for example, 12 equal parts, the chip C includes both a dense region H in which the area ratio of the metal masks is high, and a sparse region L in which the area ratio of the metal masks is low.

Generally, the reflectance of a refractory metal with respect to infrared rays is higher than the reflectance of silicon (Si) with respect to infrared rays. Thus, in the thermal treatment such as RTA using infrared rays, the infrared rays are reflected off the metal masks containing the refractory metal.

Thus, in the thermal treatment, the amount Rh of infrared rays reflected off the dense region H is larger than the amount Rl of infrared rays reflected off the sparse region L (Rh>Rl). Thus, the wafer temperature Th in the dense region H is lower than the wafer temperature Tl in the sparse region L (Th<Tl). As described above, the amount of reflected infrared rays varies in accordance with the area ratio of the metal masks, thereby varying the wafer temperature. The term "wafer temperature" refers to a temperature of a wafer (semiconductor substrate) whose temperature increases by absorbing infrared rays through a thermal treatment.

Generally, as the wafer temperature increases, the amount of the adjusting metal introduced into the high-k insulating film increases. Thus, in the thermal treatment, the amount Ah of the adjusting metal introduced into the high-k insulating film in the dense region H is lower than the amount Al of the adjusting metal introduced into the high-k insulating film in the sparse region L (Ah<Al). Therefore, the average concentration Ch of the adjusting metal contained in the high-k insulating film in the dense region H is lower than the average concentration Cl of the adjusting metal contained in the high-k insulating film in the sparse region L (Ch<Cl).

Generally, as the average concentration of the adjusting metal contained in the high-k insulating film increases, the threshold voltage of the n-type MIS transistor decreases. Thus, the threshold voltage Vh of the n-type MIS transistor in the dense region H is higher than the threshold voltage Vl of the n-type MIS transistor in the sparse region L (Vh>Vl).

As described above, in accordance with the wafer temperature of the chip, the average concentration of the adjusting metal varies, and the threshold voltage of the n-type MIS transistor varies.

As described above, in accordance with the density of the nMIS regions or the pMIS regions in the chip, the area ratio of the metal masks varies. In accordance with the area ratio of the metal masks, the wafer temperature varies, and the threshold voltage of the n-type MIS transistor varies.

Thus, as described above, generally, there are variations in density of the n, pMIS regions in the chip, resulting in variations in area ratio of the metal masks. This results in variations in wafer temperature of the chip. This causes variations in threshold voltage of n-type MIS transistors included in an identical chip.

In one general aspect, the instant application describes a semiconductor device including a MIS transistor having a gate insulating film including a high-k insulating film into which an adjusting metal is introduced by using a metal mask containing a refractory metal as an introduction prevention mask while variations in threshold voltage of MIS transistors included in an identical chip are reduced.

A method for fabricating a semiconductor device according to the above general aspect is a method for fabricating a semiconductor device including a first conductivity type first MIS transistor formed on a first active region of a semiconductor substrate, and a second conductivity type second MIS transistor formed on a second active region of the semiconductor substrate, wherein the method includes steps of: (a) forming an element isolation region in an element isolation formation region of the semiconductor substrate to surround the first active region and the second active region; (b) after the step (a), forming a gate insulating film formation film including a high-k insulating film on the semiconductor substrate; (c) forming a refractory metal film on the gate insulating film formation film; (d) patterning the refractory metal film to form a metal mask which exposes a first portion of the gate insulating film formation film located on the first active region, and covers a second portion of the gate insulating film formation film located on the second active region, and to form a dummy metal mask which covers a third portion in a region of the gate insulating film formation film located on the element isolation formation region; (e) after the step (d), forming an adjusting metal compound film containing an adjusting metal on the gate insulating film formation film provided with the metal mask and the dummy metal mask; (f) after the step (e), introducing the adjusting metal in the adjusting metal compound film into the gate insulating film formation film by a thermal treatment using the metal mask and the dummy metal mask as an introduction prevention mask; (g) after the step (f), removing the adjusting metal compound film, the metal mask, and the dummy metal mask; (h) after the step (g), forming a gate electrode formation film on the gate insulating film formation film into which the adjusting metal has been introduced; and (i) patterning the gate electrode formation film and the gate insulating film formation film to form a first gate insulating film and a first gate electrode on the first active region and to form a second gate insulating film and a second gate electrode on the second active region.

In the method for fabricating the semiconductor device according to the above general aspect, on a region of the gate insulating film formation film located on the element isolation formation region, the dummy metal mask covering the third portion in the region is formed. Thus, even when there are variations in density of regions in which first and second MIS transistors are formed in a chip, variations in area ratio of metal masks and dummy metal masks can be reduced. Thus, in a thermal treatment using, for example, infrared rays, variations in wafer temperature of the chip can be reduced. The term "area ratio of metal masks and the dummy metal masks" refers to a proportion of the surface area of metal masks and dummy metal masks to the surface area of a chip.

Thus, it is possible to reduce variations in amount of the adjusting metal introduced into the first portions of the gate insulating film formation film, and variations in average concentration of the adjusting metal contained in the first portions of the gate insulating film formation film. Thus, variations in threshold voltage of first MIS transistors included in an identical chip can be reduced.

In the method for fabricating the semiconductor device according to the above general aspect, it is preferable that in the step (f), the adjusting metal be introduced into the first portion of the gate insulating film formation film to form a first gate insulating film formation film which contains the adjusting metal, and the adjusting metal be prevented from being introduced into the second portion of the gate insulating film formation film by the metal mask to form a second gate insulating film formation film which is free of the adjusting metal, and in the (i), the first gate insulating film made of the first gate insulating film formation film and the first gate electrode be formed on the first active region, the second gate insulating film made of the second gate insulating film formation film and the second gate electrode be formed on the second active region, the first gate insulating film contain the adjusting metal, and the second gate insulating film be free of the adjusting metal.

With this method, as described above, variations in wafer temperature of the chip can be reduced, so that it is possible to reduce variations in average concentration of the adjusting metal contained in the first gate insulating film formation films.

In the method for fabricating the semiconductor device according to the above general aspect, the step (i) preferably includes forming a dummy gate insulating film and a dummy gate electrode on the element isolation formation region.

In the method for fabricating the semiconductor device according to the above general aspect, it is preferable that in the step (f), the adjusting metal be introduced into a portion except for the third portion in the region of the gate insulating film formation film located on the element isolation formation region, while the adjusting metal be prevented from being introduced into the third portion by the dummy metal mask to form a dummy gate insulating film formation film, and in the step (i), the dummy gate insulating film made of the dummy gate insulating film formation film and the dummy gate electrode be formed on the element isolation formation region.

In the method for fabricating the semiconductor device according to the above general aspect, at least a portion of the dummy gate insulating film is preferably free of the adjusting metal.

In the method for fabricating the semiconductor device according to the above general aspect, it is preferable that the step (a) include forming a dummy active region surrounded by the element isolation region in the element isolation formation region, and in the step (d), the third portion include a portion of the gate insulating film formation film located on at least part of the dummy active region.

In this method, the dummy active region is formed in the element isolation formation region. With this method, variations in density of first and second active regions and dummy active regions of a chip can be reduced. Thus, a possibility for causing variations in wafer temperature of the chip can be reduced.

As described above, the dummy active regions can reduce the possibility for causing variations in wafer temperature due to variations in density of the active regions of a chip. Additionally, as described above, the dummy metal masks can reduce variations in wafer temperature caused due to a difference in area ratio of metal masks. Thus, variations in threshold voltage of the first MIS transistors included in an identical chip can be effectively reduced.

In the method for fabricating the semiconductor device according to the above general aspect, it is preferable that the step (a) include forming a dummy active region surrounded by the element isolation region in the element isolation formation region, and in the step (d), the third portion include a portion of the gate insulating film formation film located on at least part of the dummy active region, and in the step (i), the dummy gate insulating film and the dummy gate electrode be formed to extend on both the element isolation region and the dummy active region.

The method for fabricating the semiconductor device according to the above general aspect, it is preferable that the first active region be formed in a second conductivity type first well region, the second active region be formed in a first conductivity type second well region, the dummy active region be formed in a second conductivity type third well region, the first gate insulating film contain the adjusting metal, at least a portion of the dummy gate insulating film be free of the adjusting metal.

In the method for fabricating the semiconductor device according to the above general aspect, it is preferable that the first MIS transistor be an n-type MIS transistor, the second MIS transistor be a p-type MIS transistor, and the adjusting metal be lanthanum.

In the method for fabricating the semiconductor device according to the above general aspect, it is preferable that the first MIS transistor be a p-type MIS transistor, the second MIS transistor be an n-type MIS transistor, the adjusting metal be aluminum.

According to the method for fabricating the semiconductor device according to the above general aspect, it is preferable that the gate insulating film formation film include an underlying film and a high-k insulating film formed on the underlying film, and the gate electrode formation film include a metal film and a silicon film formed on the metal film.

A semiconductor device according to the above general aspect includes: a first conductivity type first MIS transistor formed on a first active region of a semiconductor substrate; a second conductivity type second MIS transistor formed on a second active region of the semiconductor substrate; and a dummy element formed on a dummy active region of the semiconductor substrate, wherein the first MIS transistor includes a first gate insulating film which includes a first high-k insulating film formed on the first active region and contains an adjusting metal, and a first gate electrode formed on the first gate insulating film, the second MIS transistor includes a second gate insulating film which includes a second high-k insulating film formed on the second active region and is free of the adjusting metal, and a second gate electrode formed on the second gate insulating film, the dummy element includes a dummy gate insulating film which includes a dummy high-k insulating film formed on the dummy active region and at least a portion of which is free of the adjusting metal, and a dummy gate electrode formed on the dummy gate insulating film, the first active region, the second active region, and the dummy active region are surrounded by an element isolation region formed in the semiconductor substrate, the first active region is formed in a second conductivity type first well region, the second active region is formed in a first conductivity type second well region, and the dummy active region is formed in a second conductivity type third well region.

With this semiconductor device according to the above general aspect, it is possible to reduce variations in average concentration of the adjusting metal contained in the first gate insulating films included in first MIS transistors included in an identical chip, so that variations in threshold voltage of the first MIS transistors included in the identical chip can be reduced.

In the semiconductor device according to the above general aspect, the entire portion of the dummy gate insulating film is preferably free of the adjusting metal.

In the semiconductor device according to the above general aspect, the dummy gate insulating film preferably includes an adjusting-metal-containing portion which contains the adjusting metal and an adjusting-metal-free portion which is free of the adjusting metal.

In the semiconductor device according to the above general aspect, the dummy gate insulating film and the dummy gate electrode are preferably formed to extend on both the element isolation region and the dummy active region.

As described above, according to the semiconductor device according to the above general aspect and method for fabricating the same, variations in threshold voltage of first MIS transistors included in an identical chip can be reduced.

BRIEF DESCRIPTION OF THE DRAWINGS

FIGS. 1A-1C are cross-sectional views illustrating process steps of a method for fabricating a semiconductor device according to an embodiment of the present disclosure in the gate length direction in a sequential order.

FIGS. 2A-2B are cross-sectional views illustrating process steps of the method for fabricating the semiconductor device according to the embodiment of the present disclosure in the gate length direction in a sequential order.

FIGS. 4A-4B are cross-sectional views illustrating process steps of the method for fabricating the semiconductor device according to the embodiment of the present disclosure in the gate length direction in a sequential order.

FIGS. 5A-5B are views illustrating a method for fabricating a semiconductor device according to an embodiment of the present disclosure, wherein FIG. 5A is a cross-sectional view along the line Va-Va of FIG. 5B, and FIG. 5B is a plan view.

FIGS. 10A-10C are cross-sectional views illustrating process steps of a first method for fabricating a semiconductor device in a sequential order.

FIGS. 11A-11C are cross-sectional views illustrating process steps of a second method for fabricating a semiconductor device in a sequential order.

DETAILED DESCRIPTION

An embodiment of the present disclosure will be described below with reference to the drawings.

Embodiment

Figure 5A:
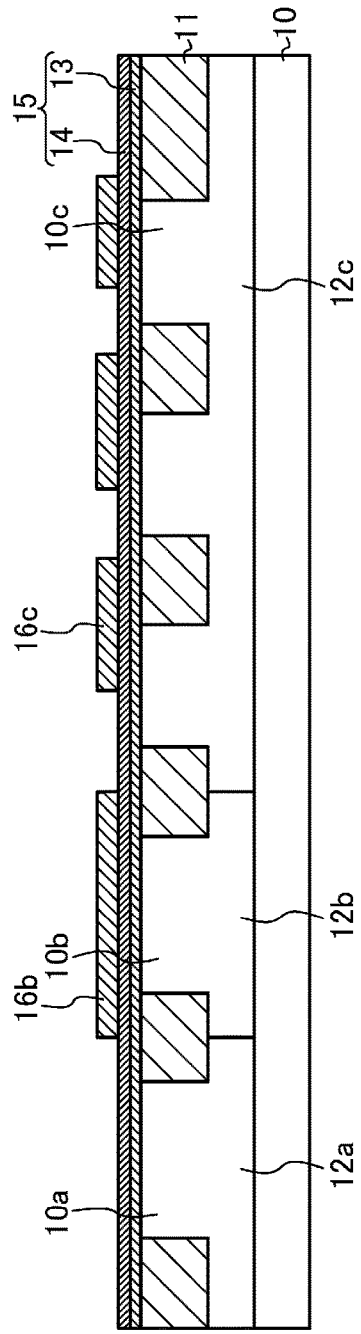
Figure 5B:
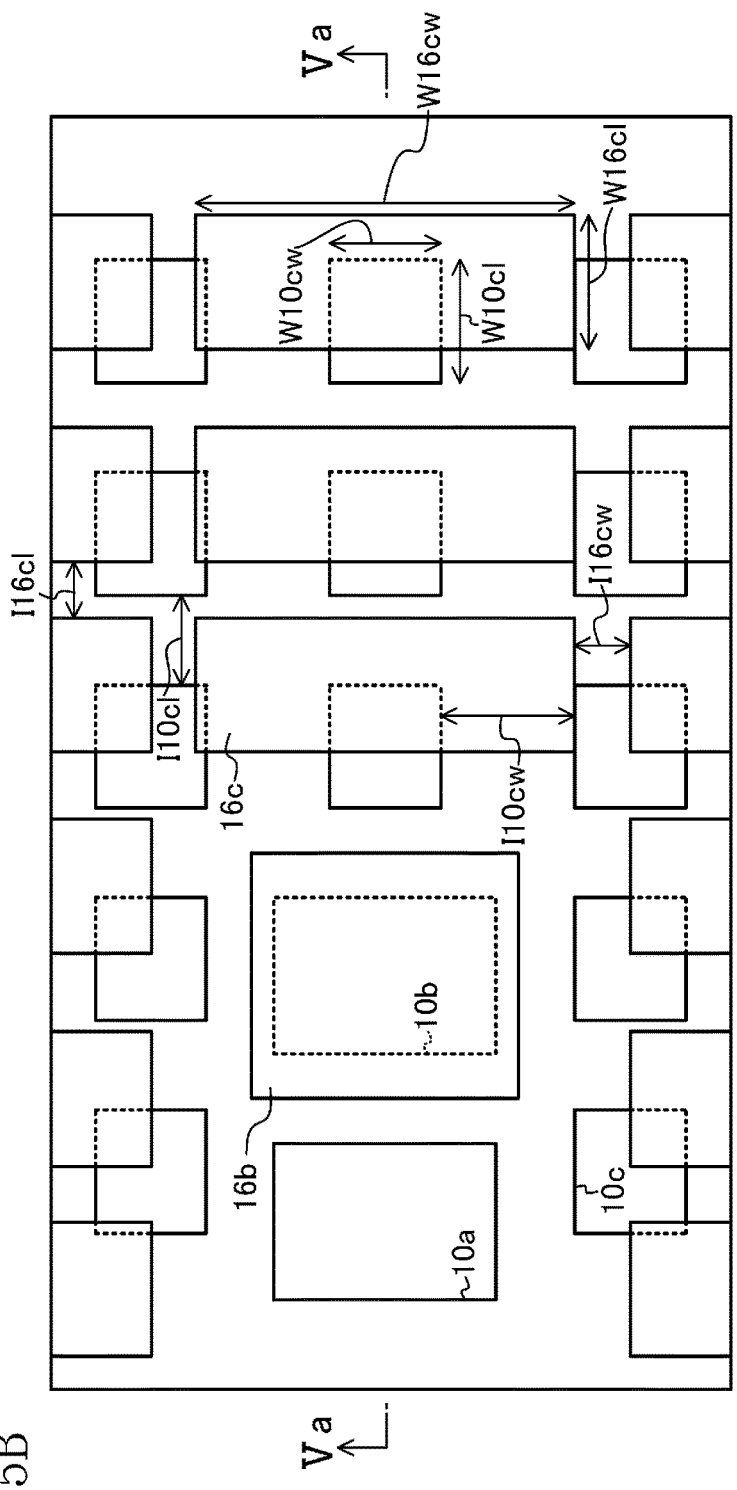

A method for fabricating a semiconductor device according to an embodiment of the present disclosure will be described below with reference to FIGS. 1A-1C, FIGS. 2A-2B, FIGS. 3A-3B, FIGS. 4A-4B, and FIGS. 5A-5B. FIGS. 1A through 4B are cross-sectional views illustrating process steps of the method for fabricating the semiconductor device according to the embodiment of the present disclosure in the gate length direction in a sequential order. FIGS. 5A-5B are views illustrating the method for fabricating the semiconductor device according to the embodiment of the present disclosure, where FIG. 5A is a cross-sectional view along the line Va-Va of FIG. 5B, and FIG. 5B is a plan view. Note that the cross section illustrated in FIG. 5A is the same that of FIG. 1C. In FIGS. 1A through 4B, the term "nMIS region" refers to a region in which an n-type first MIS transistor is formed. The term "pMIS region" refers to a region in which a p-type second MIS transistor is formed. The term "dummy region" refers to a region in which dummy elements are formed. A region indicated by arrows refers to an element isolation formation region, and the term "element isolation formation region" refers to a region including an element isolation region, and dummy active regions surrounded by the element isolation region (in other words, a region including neither a first active region nor a second active region). Note that FIGS. 1A through 4B are cross-sectional views illustrating a configuration of part of a chip included in a wafer.

First, as illustrated in FIG. 1A, an element isolation region 11 is selectively formed by, for example, a shallow trench isolation (STI) method in the element isolation formation region of a semiconductor substrate 10 made of, for example, p-type silicon (Si). As a result, a first active region 10a surrounded by the element isolation region 11 is formed in the semiconductor substrate 10 in the nMIS region. A second active region 10b surrounded by the element isolation region 11 is also formed in the semiconductor substrate 10 in the pMIS region. A plurality of dummy active regions 10c surrounded by the element isolation region 11 are also formed in the semiconductor substrate 10 in the dummy region.

The plurality of dummy active regions 10c are arranged, for example, in a matrix as illustrated in FIG. 5B, which will be described later. The plurality of dummy active regions 10c have the same shape as viewed from the top. The width W10cl of each dummy active region 10c is, for example, 0.2-10 μm in the gate length direction. The width W10cw of each dummy active region 10c is, for example, 0.4-10 μm in the gate width direction. Intervals I10cl between adjacent ones of the dummy active regions 10c in the gate length direction are equal to each other, and each interval I10cl is, for example, 0.2-5 μm. Intervals I10cw between adjacent ones of the dummy active regions 10c in the gate width direction are equal to each other, and each interval I10cw is, for example, 0.4-10 μm.

After that, a p-type first well region 12a is formed in the semiconductor substrate 10 in the nMIS region. A p-type third well region 12c is also formed in the semiconductor substrate 10 in the dummy region. On the other hand, an n-type second well region 12b is formed in the semiconductor substrate 10 in the pMIS region. Note that in the present embodiment, the conductivity type of the semiconductor substrate 10 is p-type, and thus it is not necessarily required to form the p-type first and third well regions 12a, 12c.

Next, as illustrated in FIG. 1B, an underlying film 13 having a thickness of, for example, 1 nm and made of silicon oxide ($SiO_2$) or silicon oxynitride (SiON) is formed by, for example, chemical vapor deposition (CVD) on the semiconductor substrate 10. After that, a high-k insulating film 14 having a thickness of, for example, 2 nm and made of HfSiON is formed by for example, CVD on the underlying film 13. The high-k insulating film 14 is preferably made of metal oxide having a relative dielectric constant of, for example, 10 or higher. A gate insulating film formation film 15 including the underlying film 13 and the high-k insulating film 14 is thus formed on the semiconductor substrate 10.

After that, a refractory metal film 16 having a thickness of, for example, 10 nm and made of titanium nitride (TiN) is formed by, for example, atomic layer deposition (ALD) on the gate insulating film formation film 15. The refractory metal film 16 contains, for example, titanium (Ti) as a refractory metal.

Next, as illustrated in FIG. 1C, a resist (not shown) is formed on the refractory metal film 16 by, for example, lithography, the resist exposing the refractory metal film 16 in the nMIS region, covering the refractory metal film 16 in the pMIS region, and exposing part of the refractory metal film 16 and covering the other part of the refractory metal film 16 in the dummy region. After that, by using the resist as a mask, the refractory metal film 16 is patterned by wet etching using, for example, SPM ($H_2SO_4/H_2O_2/H_2O$) as a chemical solution.

As a result, a metal mask 16b exposing a first portion of the gate insulating film formation film 15 located on the first active region 10a, and covering a second portion of the gate insulating film formation film 15 located on the second active region 10b is formed. A plurality of dummy metal masks 16c covering third portions in a region of the gate insulating film formation film 15 located on the element isolation formation region are also formed.

Figure 7:
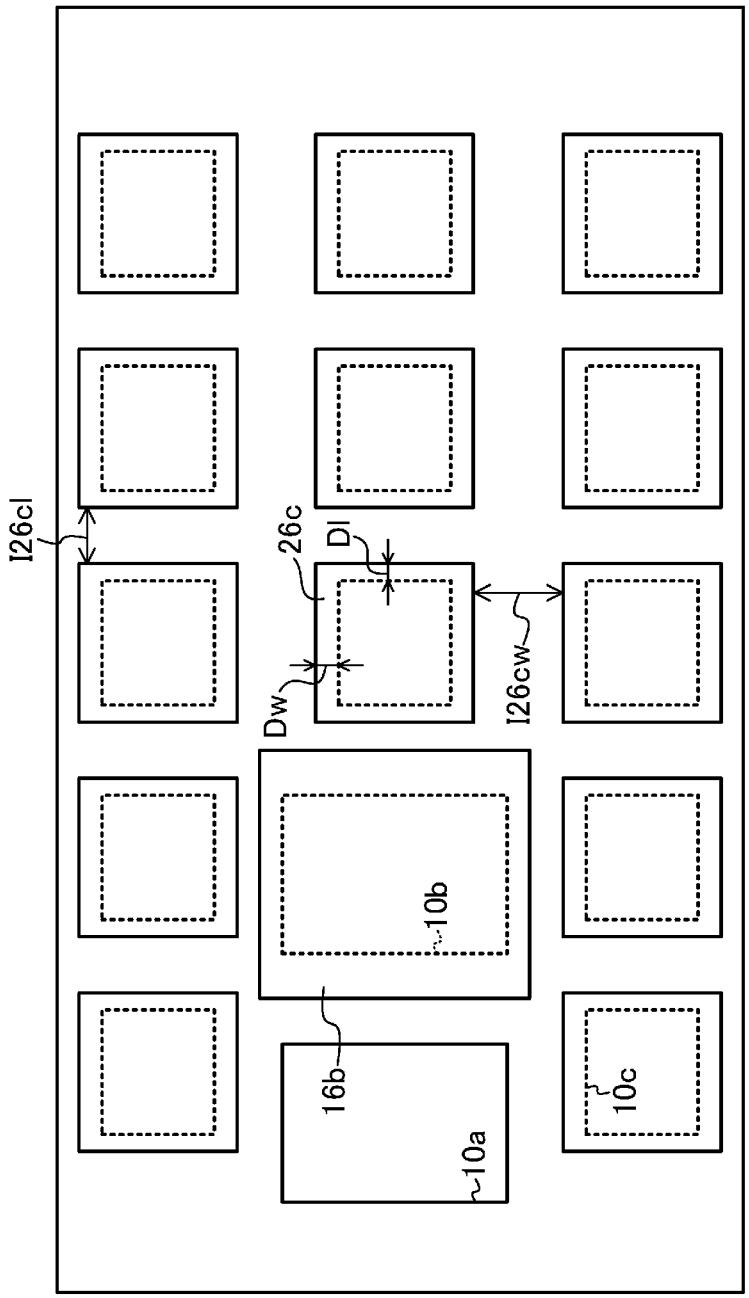
FIG. 7 is a plan view illustrating an example layout of dummy metal masks.

As illustrated in FIG. 1C, the dummy metal masks 16c cover portions of the gate insulating film formation film 15 located on part of the dummy active region 10c. In other words, the third portions of the gate insulating film formation film 15 covered with the dummy metal masks 16c include the portions of the gate insulating film formation film 15 located on part of the dummy active region 10c. Note that as illustrated in FIG. 7, which will be described later, dummy metal masks 26c each may cover a portion of a gate insulating film formation film located on the entire part of a dummy active region 10c. Thus, each third portion includes the portion of the gate insulating film formation film 15 located on at least part of the dummy active region 10c.

In the present embodiment, as illustrated in FIG. 1C and FIGS. 5A-5B, on the region of the gate insulating film formation film 15 located on the element isolation formation region, the plurality of dummy metal masks 16c covering the third portions in the region are formed. The plurality of dummy metal masks 16c are arranged in a matrix. The plurality of dummy metal masks 16c have the same shape as viewed from the top, which is, for example, rectangular. The width W16cl of each dummy metal mask 16c is, for example, 1-10 µm in the gate length direction. The width W16cw of each dummy metal mask 16c is, for example, 1-10 µm in the gate width direction. Intervals I16cl between adjacent ones of the dummy metal masks 16c in the gate length direction are equal to each other, and each interval I16cl is, for example, 0.5-2 µm. Interval I16cw between adjacent ones of the dummy metal masks 16c in the gate width direction are equal to each other, and each interval I16cw is, for example, 0.5-2 µm.

In the present embodiment, the dummy metal masks 16c are provided to adjust the area ratio of metal masks 16b and the dummy metal masks 16c. The term "area ratio of metal masks and dummy metal masks" refers to a proportion of the surface area of metal masks and dummy metal masks to the surface area of a chip.

Next, as illustrated in FIG. 2A, an adjusting metal compound film 17 having a thickness of, for example, 1 nm and made of a lanthanum oxide (LaO) film is formed by, for example, sputtering on the gate insulating film formation film 15 provided with the metal mask 16b and the dummy metal masks 16c. The adjusting metal compound film 17 contains, for example, lanthanum (La) as an adjusting metal.

Next, as illustrated in FIG. 2B, by using the metal mask 16b and the dummy metal masks 16c as an introduction prevention mask, a thermal treatment such as RTA is performed at, for example, 700° C. for 1 minute.

Through the thermal treatment, the adjusting metal in the adjusting metal compound film 17 is introduced into the first portion of the gate insulating film formation film 15, thereby forming a first gate insulating film formation film 15A including a first underlying film 13A and a first high-k insulating film 14A which contains the adjusting metal. On the other hand, the metal mask 16b prevents the adjusting metal in the adjusting metal compound film 17 from being introduced into the second portion of the gate insulating film formation film 15, thereby forming a second gate insulating film formation film 15B including a second underlying film 13B and a second high-k insulating film 14B which is free of the adjusting metal. Note that the first and second underlying films 13A, 13B are portions of the underlying film 13 located on the first and second active regions 10a, 10b.

The adjusting metal in the adjusting metal compound film 17 is introduced into a portion except for the third portions in the region of the gate insulating film formation film 15 located on the element isolation formation region, while the adjusting metal in the adjusting metal compound film 17 is prevented from being introduced into the third portions by the dummy metal masks 16c, thereby forming a dummy gate insulating film formation film 15C including a dummy underlying film 13C and a dummy high-k insulating film 14C, portions (see 14Cx) of which contain the adjusting metal, and the other portions (see 14Cy) of which are free of the adjusting metal. The dummy high-k insulating film 14C includes adjusting-metal-containing portions 14Cx which contain the adjusting metal and adjusting-metal-free portions 14Cy which are free of the adjusting metal. Note that the dummy underlying film 13C is a portion of the underlying film 13 located on the element isolation formation region.

The gate insulating film formation film including the first gate insulating film formation film 15A which contains the adjusting metal, the second gate insulating film formation film 15B which is free of the adjusting metal, and the dummy gate insulating film formation film 15C portions of which contain the adjusting metal and the other portions of which are free of the adjusting metal is thus formed.

Figure 3A:
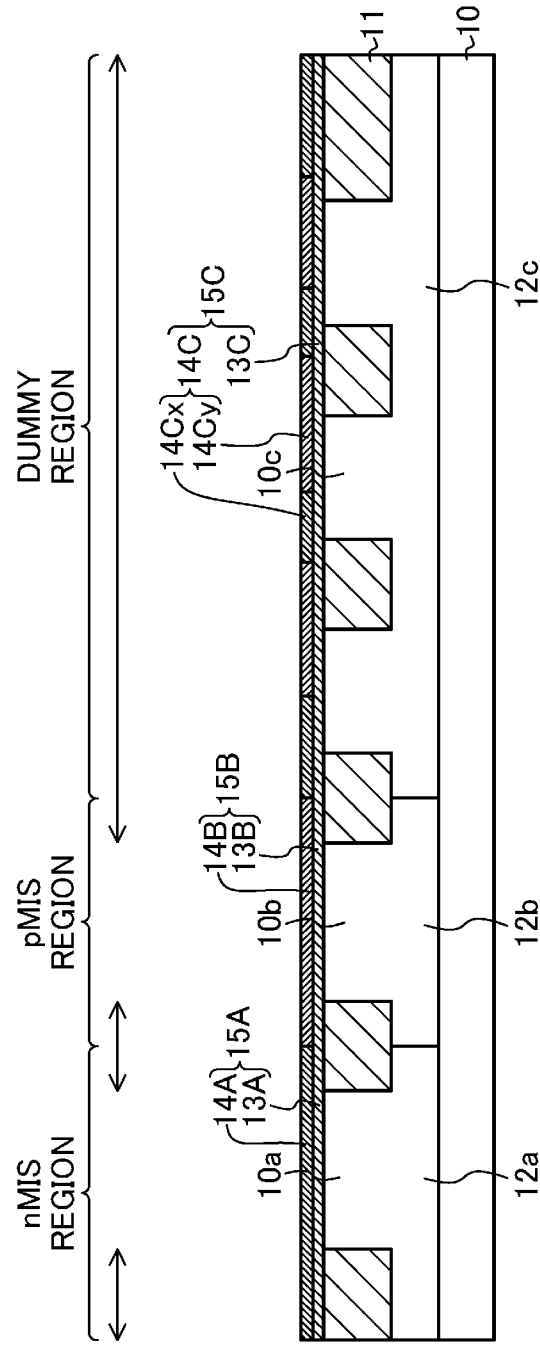
FIGS. 3A-3B are cross-sectional views illustrating process steps of the method for fabricating the semiconductor device according to the embodiment of the present disclosure in the gate length direction in a sequential order.

Next, as illustrated in FIG. 3A, unreacted portions of the adjusting metal compound film 17, the metal mask 16b, and the dummy metal masks 16c are removed by wet etching using, for example, hydrochloric acid (HCl) as chemical solution.

Figure 3B:
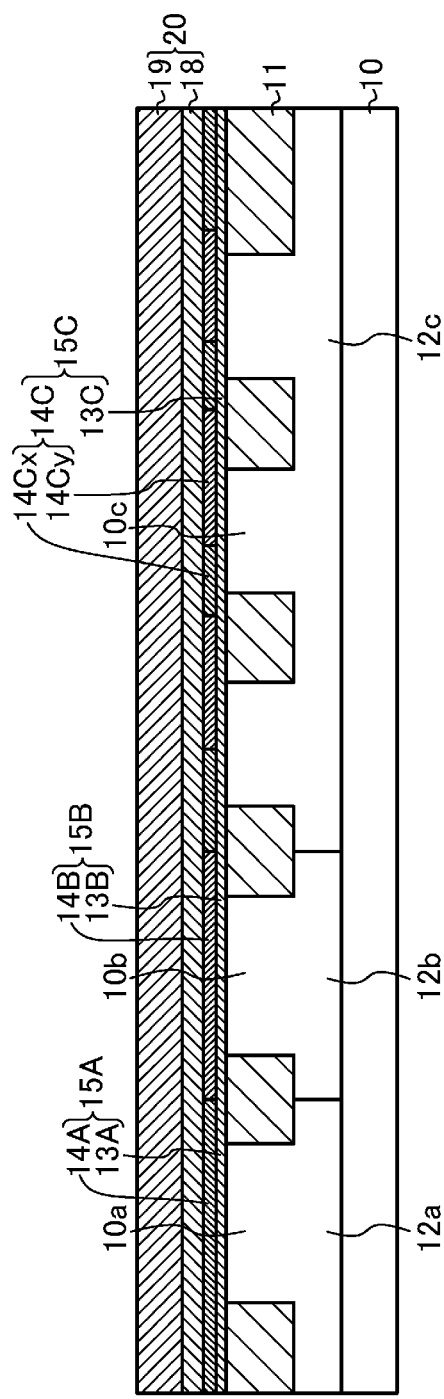

Next, as illustrated in FIG. 3B, a metal film 18 having a thickness of, for example, 10 nm and made of TiN is formed by, for example, ALD on the gate insulating film formation film into which the adjusting metal has been introduced. After that, a silicon film 19 having a thickness of, for example, 60 nm and made of polysilicon is formed by, for example, CVD on the metal film 18. As a result, a gate electrode formation film 20 including the metal film 18 and the silicon film 19 is formed on the gate insulating film formation film.

Next, as illustrated in FIG. 4A, a resist (not shown) is formed by lithography on the gate electrode formation film 20. After that, by using the resist as a mask, the gate electrode formation film 20 and the gate insulating film formation film including the first and second gate insulating film formation films 15A, 15B and the dummy gate insulating film formation film 15C are patterned by etching.

As a result, on the first active region 10a, a first gate insulating film 15a including a first underlying film 13a and a first high-k insulating film 14a which contains the adjusting metal, and a first gate electrode 20a including a first metal film 18a and a first silicon film 19a are formed.

On the second active region 10b, a second gate insulating film 15b including a second underlying film 13b and a second high-k insulating film 14b which is free of the adjusting metal, and a second gate electrode 20b including a second metal film 18b and a second silicon film 19b are also formed.

On the element isolation formation region of the semiconductor substrate 10, dummy gate insulating films 15c-15g including dummy underlying films 13c-13g and dummy high-k insulating films 14c-14g, and dummy gate electrodes 20c-20g including dummy metal films 18c-18g and dummy silicon films 19c-19g are also formed.

The entire portion of the dummy high-k insulating film 14c contains the adjusting metal. The entire portion of each of the dummy high-k insulating films 14d, 14e is free of the adjusting metal. One portion of each of the dummy high-k insulating films 14f, 14g contains the adjusting metal, whereas the other portion of each of the dummy high-k insulating films 14f, 14g is free of the adjusting metal. In other words, the dummy high-k insulating film 14f includes an adjusting-metal-containing portion 14fx and an adjusting-metal-free portion 14fy, and the dummy high-k insulating film 14g includes an adjusting-metal-containing portion 14gx and an adjusting-metal-free portion 14gy.

Next, as illustrated in FIG. 4B, n-type extension regions 21a are formed laterally below the first gate electrode 20a in the first active region 10a. N-type dummy extension regions 21c-21f are also formed laterally below the dummy gate electrodes 20c-20f in the dummy active regions 10c. On the other hand, p-type extension regions 21b are formed laterally below the second gate electrode 20b in the second active region 10b.

After that, first and second sidewalls 22a, 22b are formed on side surfaces of the first and second gate electrodes 20a, 20b. Dummy sidewalls 22c-22g are also formed on side surfaces of the dummy gate electrodes 20c-20g.

After that, n-type source/drain regions 23a are formed outside and below the first sidewalls 22a in the first active region 10a. N-type dummy source/drain regions 23c-23g are also formed outside and below the dummy sidewalls 22c-22g in the dummy active regions 10c. On the other hand, p-type source/drain regions 23b are formed outside and below the second sidewalls 22b in the second active region 10b.

The semiconductor device according to the present embodiment can thus be formed.

A configuration of the semiconductor device according to an embodiment of the present disclosure will be described below with reference to FIG. 4B.

The semiconductor device according to the present embodiment includes an n-type (first conductivity type) first MIS transistor Tr1, a p-type (second conductivity type) second MIS transistor Tr2, and dummy elements E1-E5.

The first MIS transistor Tr1 includes a first gate insulating film 15a which is formed on a first active region 10a and contains an adjusting metal (e.g., La), a first gate electrode 20a formed on the first gate insulating film 15a, n-type extension regions 21a formed on both sides of and below the first gate electrode 20a in the first active region 10a, first sidewalls 22a formed on side surfaces of the first gate electrode 20a, and n-type source/drain regions 23a formed on both outer sides of and below the first sidewalls 22a in the first active region 10a.

The second MIS transistor Tr2 includes a second gate insulating film 15b which is formed on a second active region 10b and is free of the adjusting metal, a second gate electrode 20b formed on the second gate insulating film 15b, p-type extension regions 21b formed on both sides of and below the second gate electrode 20b in the second active region 10b, second sidewalls 22b formed on side surfaces of the second gate electrode 20b, and p-type source/drain regions 23b formed on both outer sides of and below the second sidewalls 22b in the second active region 10b.

The dummy element E1 includes a dummy gate insulating film 15c formed to extend on both an element isolation region 11 and a dummy active region 10c, a dummy gate electrode 20c formed on the dummy gate insulating film 15c, an n-type dummy extension region 21c formed on the right side of and below the dummy gate electrode 20c in the dummy active region 10c, dummy sidewalls 22c formed on side surfaces of the dummy gate electrode 20c, and an n-type dummy source/drain region 23c formed on the right side of and below the dummy sidewalls 22c in the dummy active region 10c.

The dummy element E2 includes a dummy gate insulating film 15d formed on the element isolation region 11, a dummy gate electrode 20d formed on the dummy gate insulating film 15d, an n-type dummy extension region 21d formed on the left side of and below the dummy gate electrode 20d in a dummy active region 10c, dummy sidewalls 22d formed on side surfaces of the dummy gate electrode 20d, and an n-type dummy source/drain region 23d formed on the left side of and below the dummy sidewalls 22d in the dummy active region 10c.

The dummy element E3 includes a dummy gate insulating film 15e formed on a dummy active region 10c, a dummy gate electrode 20e formed on the dummy gate insulating film 15e, an n-type dummy extension region 21e formed on the left side of and below the dummy gate electrode 20e in the dummy active region 10c, dummy sidewalls 22e formed on side surfaces of the dummy gate electrode 20e, and an n-type dummy source/drain region 23e formed on the left side of and below the dummy sidewalls 22e in the dummy active region 10c.

The dummy element E4 includes a dummy gate insulating film 15f formed to extend on both the element isolation region 11 and a dummy active region 10c, a dummy gate electrode 20f formed on the dummy gate insulating film 15f, an n-type dummy extension region 21f formed on the right side of and below the dummy gate electrode 20f in the dummy active region 10c, dummy sidewalls 22f formed on side surfaces of the dummy gate electrode 20f, and an n-type dummy source/drain region 23f formed on the right side of and below the dummy sidewalls 22f in the dummy active region 10c.

The dummy element E5 includes a dummy gate insulating film 15g formed on the element isolation region 11, a dummy gate electrode 20g formed on the dummy gate insulating film 15g, dummy sidewalls 22g formed on side surfaces of the dummy gate electrode 20g, and an n-type dummy source/drain region 23g formed on the left side of and below the dummy sidewalls 22g in the dummy active region 10c.

The first active region 10a, the second active region 10b, and the dummy active regions 10c are surrounded by the element isolation region 11.

The first active region 10a is formed in a p-type first well region 12a. The second active region 10b is formed in an n-type second well region 12b. The dummy active regions 10c are formed in a p-type third well region 12c.

The first gate insulating film 15a contains the adjusting metal. The second gate insulating film 15b is free of the adjusting metal.

The dummy gate insulating film 15c contains the adjusting metal. The entire portion of each of the dummy gate insulating films 15d, 15e is free of the adjusting metal. One portion of each of the dummy gate insulating films 15f, 15g contains the adjusting metal, whereas the other portion of each of the dummy gate insulating films 15f, 15g is free of the adjusting metal. In other words, each of the dummy gate insulating films 15f, 15g includes an adjusting-metal-containing portion which contains the adjusting metal and an adjusting-metal-free portion which is free of the adjusting metal.

The first gate insulating film 15a includes a first underlying film 13a and a first high-k insulating film 14a. The second gate insulating film 15b includes a second underlying film 13b and a second high-k insulating film 14b. The dummy gate insulating films 15c-15g include dummy underlying films 13c-13g and dummy high-k insulating films 14c-14g.

The first high-k insulating film 14a contains the adjusting metal. The second high-k insulating film 14b is free of the adjusting metal.

The entire portion of the dummy high-k insulating film 14c contains the adjusting metal. The entire portion of each of the dummy high-k insulating films 14d, 14e is free of the adjusting metal. One portion of each of the dummy high-k insulating films 14f, 14g contains the adjusting metal, whereas the other portion of each of the dummy high-k insulating films 14f, 14g is free of the adjusting metal. In other words, the dummy high-k insulating film 14f includes an adjusting-metal-containing portion 14fx which contains the adjusting metal and an adjusting-metal-free portion 14fy which is free of the adjusting metal, and the dummy high-k insulating film 14g includes an adjusting-metal-containing portion 14gx which contains the adjusting metal and an adjusting-metal-free portion 14gy which is free of the adjusting metal.

The first gate electrode 20a includes a first metal film 18a and a first silicon film 19a. The second gate electrode 20b includes a second metal film 18b and a second silicon film 19b. The dummy gate electrodes 20c-20g include dummy metal films 18c-18g and dummy silicon films 19c-19g.

The dummy gate insulating films 15c, 15f and the dummy gate electrodes 20c, 20f are formed to extend on both the element isolation region 11 and the dummy active regions 10c. The dummy gate insulating films 15d, 15g and the dummy gate electrodes 20d, 20g are formed on the element isolation region 11. The dummy gate insulating film 15e and the dummy gate electrode 20e are formed on the dummy active region 10c.

The dummy source/drain region 23c and the dummy source/drain region 23d are adjacent to each other. The dummy source/drain region 23f and the dummy source/drain region 23g are adjacent to each other.

Figure 6:
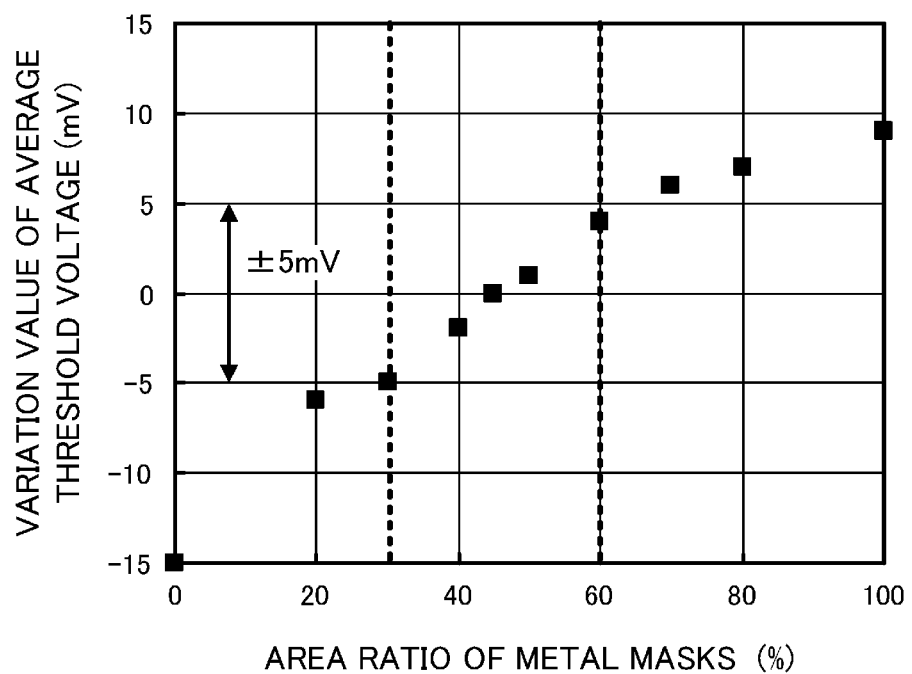
FIG. 6 is a graph illustrating the relationship between the area ratio of metal masks and the variation value of an average threshold voltage.

The relationship between the area ratio of metal masks containing a refractory metal and the variation value of an average threshold voltage will be described below with reference to FIG. 6. FIG. 6 is a graph illustrating the relationship between the area ratio of the metal masks and the variation value of the average threshold voltage.

A chip used to obtain the graph illustrated in FIG. 6 is a test chip, and the test chip has the following configuration.

Generally, a wafer includes a plurality of chips which will be products and a test chip on which tests are performed. The test chip includes a plurality of partitioned blocks, for example, blocks whose area ratio of metal masks is X % (X=20, 30, 40, 45, 50, 60, 70, 80, 100). Each block includes a plurality of n-type MIS transistors, etc. The term "area ratio of metal masks" refers to a proportion of the surface area of metal masks to the surface area of a test chip.

Gate insulating films included in the n-type MIS transistors of each block include high-k insulating films containing La. Each high-k insulating film containing La is a high-k insulating film into which La in an adjusting metal oxide film having a thickness of 1 nm and made of LaO has been introduced by RTA at 700° C. for 1 minute.

The variation value of the average threshold voltage is obtained in a manner as described below.

An average threshold voltage V45 obtained by averaging threshold voltages of the plurality of n-type MIS transistors included in a block whose area ratio of the metal masks is 45% is referenced as 0. The average threshold voltage V45 is subtracted from an average threshold voltage Vx obtained by averaging threshold voltages of a plurality of n-type MIS transistors included in a block whose area ratio of the metal masks is X %, thereby obtaining the variation value of the average threshold voltage. Here, since the area ratio of the metal masks of the present test chip is 45%, the average threshold voltage V45 is referenced as 0.

The variation value of an average threshold voltage is the average threshold voltage V45 subtracted from the average threshold voltage Vx.

As illustrated in FIG. 6, when the area ratio of the metal masks is lower than 45%, the variation value of the average threshold voltage shows a negative variation value. As the area ratio of the metal masks further decreases below 45%, the variation value of the average threshold voltage increases in a negative direction. In other words, as the area ratio of the metal masks further decreases below 45%, the average threshold voltage lowers.

In contrast, when the area ratio of the metal masks is higher than 45%, the variation value of the average threshold voltage shows a positive variation value. As the area ratio of the metal masks further increases above 45%, the variation value of the average threshold voltage increases in a positive direction. In other words, as the area ratio of the metal masks further increases above 45%, the average threshold voltage increases.

Thus, as the area ratio of the metal masks decreases, the average threshold voltage lowers. As can be seen from this relationship, as the area ratio of the metal masks decreases, the wafer temperature increases, thereby increasing the average concentration of La contained in the high-k insulating film.

According to the present embodiment, as illustrated in FIG. 1C, on the region of the gate insulating film formation film 15 located on the element isolation formation region, the dummy metal masks 16c covering the third portions in the region are formed. With this configuration, even when there are variations in density of n, pMIS regions in a chip, variations in area ratio of metal masks 16b and the dummy metal masks 16c can be reduced. Thus, in a thermal treatment such as RTA using, for example, infrared rays, variations in wafer temperature of the chip can be reduced.

This can reduce variations in amount of the adjusting metal introduced into the first portions of the gate insulating film formation film 15, and variations in average concentration of the adjusting metal contained in the first gate insulating film formation films 15A. Thus, variations in average concentration of the adjusting metal contained in the first gate insulating films 15a included in first MIS transistors Tr1 included in an identical chip can be reduced, so that variations in threshold voltage of the first MIS transistors Tr1 included in the identical chip can be reduced.

For example, dummy metal masks are formed such that when a chip is divided into a plurality of regions having the same plane area, the area ratio of metal masks and the dummy metal masks in each region falls within the range from 30% to 60%. Thus, as can be seen from FIG. 6, a difference in average threshold voltage between the regions can be within a range of ±5 mV, and variations in threshold voltage of first MIS transistors included in an identical chip can be reduced. Here, the average threshold voltage of each region is obtained by averaging threshold voltages of the plurality of first MIS transistors included in each region. Examples of the shape of the divided region as viewed from the top include, for example, a rectangular shape having a width of 20-500 µm.

In order to obtain advantages of the present disclosure, it is clearly preferable to form, not one dummy metal mask having a relatively large surface area, but a plurality of dummy metal masks each having a relatively small surface area in distributed locations to adjust the area ratio of the metal masks and the dummy metal masks. For example, when the area ratio of the metal masks and the dummy metal masks is adjusted to X %, not one dummy metal mask having a surface area of Y $\mu m^2$, but n dummy metal masks each having a surface area of y (y<Y) $\mu m^2$ are preferably formed in distributed locations (Y=y×n).

Forming the dummy active regions 10c in the element isolation formation region can offer the following advantages.

First, the following advantages can be obtained.

Generally, the reflectance RSi of Si with respect to infrared rays is higher than the reflectance $RSiO_2$ of $SiO_2$ with respect to infrared rays (RSi>$RSiO_2$). Thus, in a thermal treatment such as RTA using infrared rays, the infrared rays penetrating through the high-k insulating film 14 and the underlying film 13 are reflected off an active region containing Si.

Thus, when a chip includes both a dense region in which density (density level) of active regions is high, and a sparse region in which density of the active regions is low, the amount of infrared rays reflected off the dense region may be larger than the amount of infrared rays reflected off the sparse region in the thermal treatment. Thus, the wafer temperature may be lower in the dense region than in the sparse region.

As described above, in accordance with the density of the active regions in the chip, the wafer temperature varies, and there is a possibility for causing variations in wafer temperature. When the variations in wafer temperature of the chip are caused, as previously described, a problem arises where variations in threshold voltage of n-type MIS transistors included in an identical chip are caused.

Thus, in the present embodiment, as illustrated in FIG. 5B, the dummy active regions 10c are formed in the element isolation formation region. With this configuration, variations in density of the first and second active regions 10a, 10b, and the dummy active regions 10c in the chip can relatively be reduced. Thus, the variations in wafer temperature of the chip can relatively be reduced.

In contrast, for example, as illustrated in FIG. 10A or FIG. 11A, when an element isolation region 101 is formed in the entire area of the element isolation formation region, and no dummy active region is formed, variations in density of the first and second active regions 100a, 100b in a chip are relatively large. Thus, the variations in wafer temperature of the chip are relatively large.

As described above, the dummy active regions 10c can reduce the possibility for causing the variations in wafer temperature which may be caused due to variations in density of the active regions in a chip. In addition, as previously described, the dummy metal masks 16c can reduce the variations in wafer temperature due to a difference in area ratio of the metal masks. Thus, it is possible to effectively reduce variations in threshold voltage of the first MIS transistors included in the identical chip. That is, the objective of the present disclosure can be effectively achieved.

Note that as previously described, the reflectance RM of the refractory metal with respect to infrared rays is higher than the reflectance RSi of Si with respect to infrared rays (RM>RSi). Here, a difference between the reflectance RM and the reflectance RSi is relatively large, whereas a difference between the reflectance RSi and the reflectance $RSiO_2$ is relatively small. Thus, the variations in wafer temperature caused due to the difference in area ratio of the metal masks are relatively large. On the other hand, the variations in wafer temperature caused due to the variations in density of the active regions in a chip are relatively small. Thus, even when dummy metal masks are provided without providing dummy active regions, the objective of the present disclosure can be satisfactorily achieved.

Second, the following advantages can be obtained.

In the present embodiment, although detailed description has been omitted, the element isolation region is formed in a manner as described below. A trench is formed in an upper portion of a semiconductor substrate made of, for example, Si, and then an insulating film made of, for example, $SiO_2$ is formed on the semiconductor substrate to fill the trench. After that, portions of the insulating film formed outside the trench are removed by chemical mechanical polishing (CMP). The element isolation region which is the insulating film filled in the trench is thus formed.

When the width of the trench filled with the insulating film is large, a phenomenon called dishing may occur in the removal by CMP. That is, part of the insulating film filled in a center portion of the trench is excessively removed by polishing compared to part of the insulating film filled in a peripheral portion of the trench, so that a surface of the insulating film filled in the trench may have a recess. Thus, as illustrated in FIG. 10A or FIG. 11A, when the element isolation region 101 is formed in the entire area of the element isolation formation region of the semiconductor substrate 100, and no dummy active region is formed, for example, the width of the trench illustrated on the right in the figure is relatively large, so that a surface of the insulating film filled in the trench may have a recess.

For this reason, in the present embodiment, as illustrated in FIG. 5B, the dummy active regions 10c are formed in the element isolation formation region. With this configuration, the plurality of trenches formed in the upper portions of the semiconductor substrate 10 each have a relatively small width, and thus it is possible to prevent the occurrence of dishing in the removal by CMP, thereby preventing formation of a recess on the surface of the insulating film filed in the trench.

When the dummy gate insulating films and the dummy gate electrodes are formed on the element isolation formation region, the following advantages can be obtained.

Although description has been omitted in the present embodiment, after the step illustrated in FIG. 4B, on the semiconductor substrate, an interlayer insulating film is formed to cover the first and second gate electrodes and the dummy gate electrodes, and then the interlayer insulating film is removed by CMP, thereby planarizing a surface of the interlayer insulating film.

When both a sparse region in which the gate insulating films and the gate electrodes (hereinafter referred to as "gate patterns") are sparsely arranged, and a dense region in which the gate patterns are densely arranged exist, dishing occurs in the removal by CMP. That is, the sparse region of the interlayer insulating film is excessively removed by polishing compared to the dense region of the interlayer insulating film, so that a difference arises between the thickness in the sparse region and the thickness in the dense region of the interlayer insulating film. Thus, it is not possible to planarize the surface of the interlayer insulating film.

For this reason, in the present embodiment, as illustrated in FIG. 4B, the dummy gate insulating films 15c-15g and the dummy gate electrodes 20c-20g (hereinafter referred to as "dummy gate patterns") are formed on the element isolation formation region. With this configuration, variations in density (density level) of the gate patterns and the dummy gate patterns can be reduced. Thus, it is possible to prevent dishing in the removal by CMP, and to planarize the surface of the interlayer insulating film.

Note that in the present embodiment, the dummy active regions 10c formed in the element isolation formation region have been described as a specific example, but the present disclosure is not limited to this embodiment. For example, as illustrated in FIG. 10A and FIG. 11A, the element isolation region 101 may be formed in the entire area of the element isolation formation region, and the dummy active regions are not necessarily formed.

Note that in the present embodiment, the dummy gate insulating films 15c-15g and the dummy gate electrodes 20c-20g formed on the element isolation formation region have been described as a specific example, but the present disclosure is not limited to this embodiment. For example, the dummy gate insulating films and the dummy gate electrodes are not necessarily formed on the element isolation formation region.

Note that in the present embodiment, as illustrated in FIG. 5B, the case where the dummy metal masks 16c each cover only part of the dummy active region 10c has been described as a specific example, but the present disclosure is not limited to this embodiment.

For example, as illustrated in FIG. 7, each dummy metal mask 26c may cover the entire part of the dummy active region 10c. Moreover, as illustrated in FIG. 7, the plurality of dummy metal masks 26c are formed to have the same shape as viewed from the top, and the interval I26cl, the interval I26cw, the distance Dl, and the distance Dw may be set to have the same length. With this configuration, in the thermal treatment, variations in amount of infrared rays reflected off the chip can be reduced. Thus, variations in wafer temperature of the chip can be effectively reduced.

Note that in the present embodiment, as illustrated in FIG. 5B, surface areas of regions covered with the dummy metal masks 16c in the dummy active regions 10c are different from each other, but the present disclosure is not limited to this embodiment.

Figure 8:
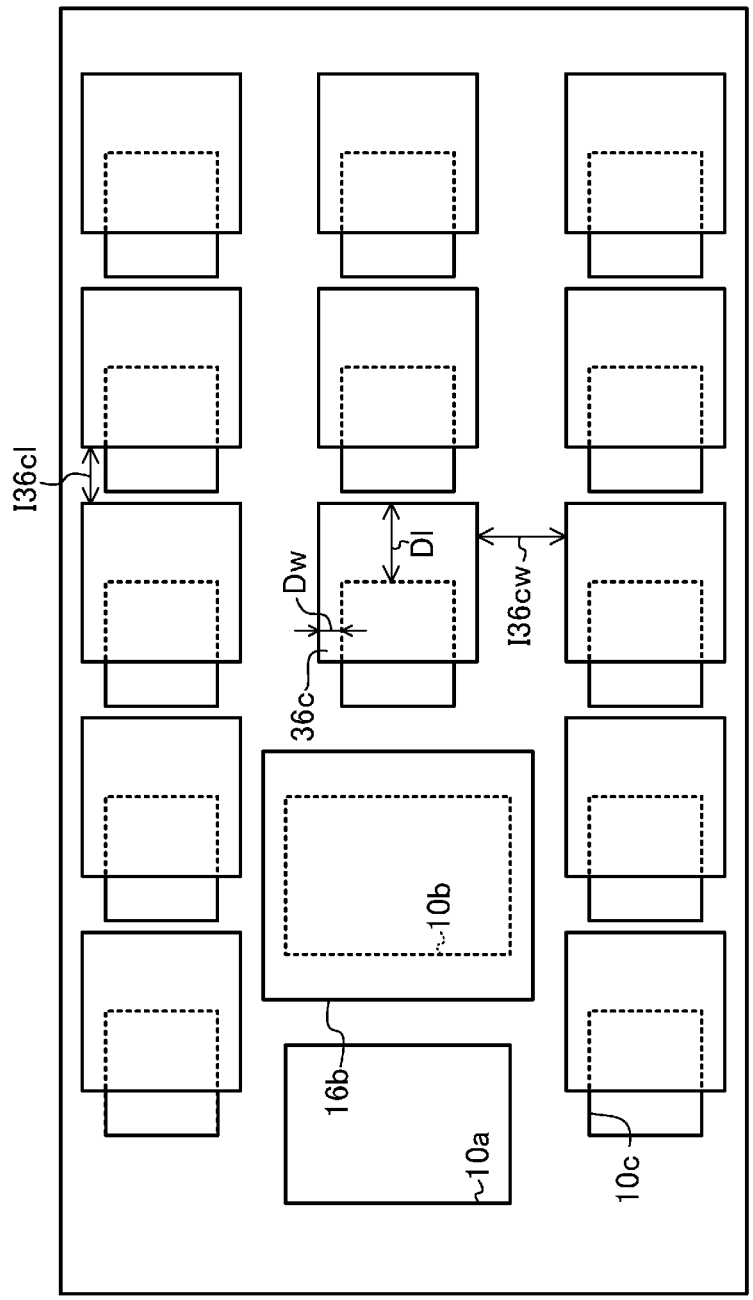
FIG. 8 is a plan view illustrating another example layout of dummy metal masks.
Figure 9A:
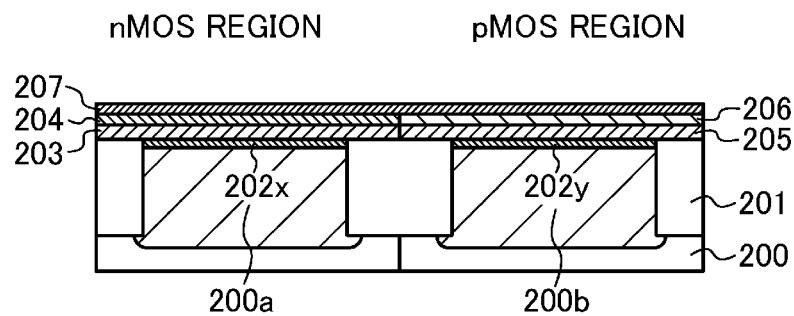
FIGS. 9A-9D are cross-sectional views illustrating process steps of a method for fabricating a conventional semiconductor device in the gate length direction in a sequential order.
Figure 9B:
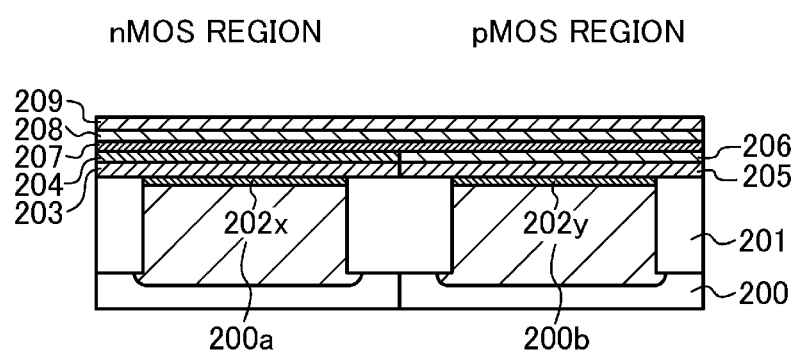
Figure 9C:
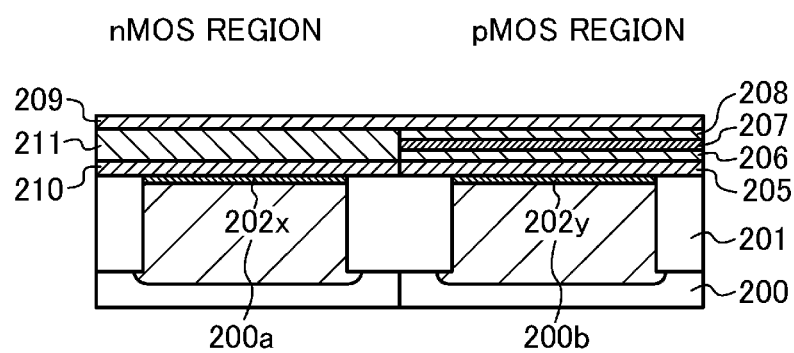
Figure 9D:
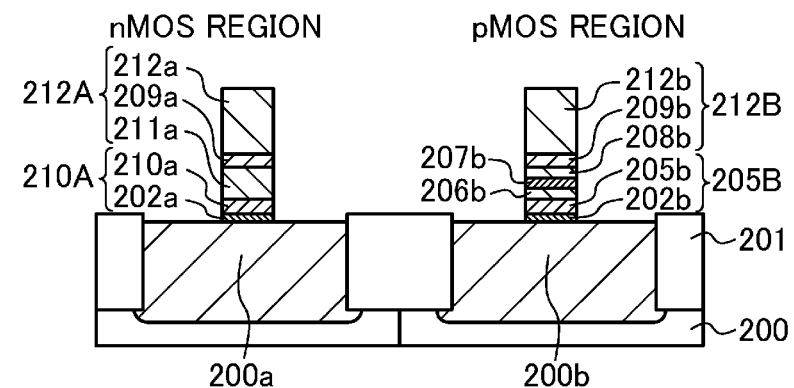
Figure 12:
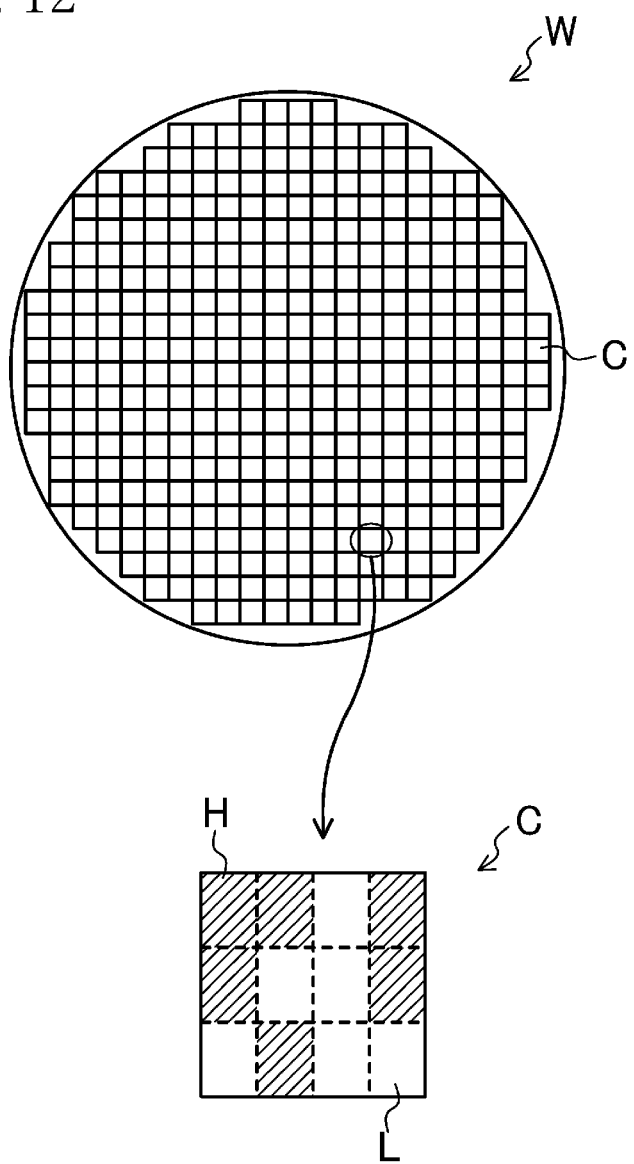
FIG. 12 is a plan view illustrating a configuration of a wafer.

For example, as illustrated in FIG. 8, surface areas of regions covered with dummy metal masks 36c in dummy active regions 10c may be equal to each other. Moreover, as illustrated in FIG. 8, the plurality of dummy metal masks 36c may have the same shape as viewed from the top, and the interval I36cl, the interval I36cw, the distance Dl, and the distance Dw may be set to the same length. With this configuration, in the thermal treatment, variations in amount of infrared rays reflected off the chip can be reduced. Thus, variations in wafer temperature of the chip can be effectively reduced.

In FIGS. 7-8, the term "interval I26cl" and the term "interval I36cl" respectively refer to an interval between the dummy metal masks 26c and an interval between the dummy metal masks 36c adjacent to each other in the gate length direction. The term "interval I26cw" and the term "interval I36cw" respectively refer to an interval between the dummy metal masks 26c and an interval between the dummy metal masks 36c adjacent to each other in the gate width direction. The term "distance Dl" refers to a distance from one end of the dummy active region 10c to one end of the dummy metal mask 26c, 36c. The term "distance Dw" refers to a distance from the other end of the dummy active region 10c to the other end of the dummy metal mask 26c, 36c.

Note that in the present embodiment, as illustrated in FIG. 5B, the surface area of the dummy metal masks 16c which is larger than that of the dummy active regions 10c has been described as a specific example, but the present disclosure is not limited to this embodiment. For example, the surface area of the dummy metal masks may be the same as the surface area of the dummy active regions, or may be smaller than the surface area of the dummy active regions.

Note that in the present embodiment, La used as the adjusting metal contained in the adjusting metal compound film 17 has been described as a specific example, but the present disclosure is not limited to this embodiment. Instead of La, for example, other lanthanoid elements, magnesium (Mg), or the like may be used.

Note that in the present embodiment, an adjusting-metal-containing metal oxide film (specifically, for example, a LaO film) used as the adjusting metal compound film 17 has been described as a specific example, but the present disclosure is not limited to this embodiment. For example, a metal nitride film containing an adjusting metal, or a metal film such as a La film containing an adjusting metal may be used.

Note that in the present embodiment, a TiN film used as the refractory metal film 16 has been described as a specific example, but the present disclosure is not limited to this embodiment. Instead of the TiN film, for example, a tantalum film (Ta film), a tantalum nitride film (TaN film), a tantalum carbide film (TaC film), tantalum carbonitride film (TaCN film), or tungsten film (W film) may be used.

In the present embodiment, the case where the metal mask 16b exposing the first portion of the gate insulating film formation film 15 and covering the second portion of the gate insulating film formation film 15 and the dummy metal masks 16c are used as an introduction prevention mask to introduce the adjusting metal in the adjusting metal compound film 17 into the first portion of the gate insulating film formation film 15 has been described, but the present disclosure is not limited to this embodiment.

For example, a metal mask covering the first portion of the gate insulating film formation film and exposing the second portion of the gate insulating film formation film and dummy metal masks may be used as an introduction prevention mask to introduce an adjusting metal in an adjusting metal compound film into the second portion of the gate insulating film formation film. The adjusting metal compound film is, for example, a film containing Al such as an aluminum oxide film ($Al_2O_3$ film) and an aluminum film (Al film), or tantalum oxide film (TaO film), etc. As described above, examples of the adjusting metal compound film include metal oxide films containing an adjusting metal, metal nitride films containing an adjusting metal, or metal films containing an adjusting metal.

With this configuration, variations in wafer temperature due to a difference in area ratio of the metal masks can be reduced by the dummy metal masks. Thus, it is possible to reduce variations in average concentration of the adjusting metal contained in the second gate insulating films included in the second MIS transistors included in an identical chip, so that variations in threshold voltage of the second MIS transistors included in the identical chip can be reduced.

Note that as described above, the present disclosure can reduce variations in threshold voltage of MIS transistors included in an identical chip, and thus is useful for semiconductor devices including MIS transistors having gate insulating films containing an adjusting metal, and methods for fabricating the same.

What is claimed is:

1. A semiconductor device comprising:
a first conductivity type first MIS transistor formed on a first active region of a semiconductor substrate;
a second conductivity type second MIS transistor formed on a second active region of the semiconductor substrate, the second conductivity type differs from the first conductivity type; and
a first dummy element formed on a first dummy active region of the semiconductor substrate, wherein
the first MIS transistor includes:
a first gate insulating film which includes a first high dielectric constant insulating film formed on the first active region and contains an adjusting metal, and
a first gate electrode formed on the first gate insulating film,
the second MIS transistor includes:
a second gate insulating film which includes a second high dielectric constant insulating film formed on the second active region and is free of the adjusting metal, and
a second gate electrode formed on the second gate insulating film,
the first dummy element includes:
a first dummy gate insulating film which includes a first dummy high dielectric constant insulating film formed on the first dummy active region and at least a portion of which is free of the adjusting metal, the first dummy gate insulating film does not include an element isolation region, and
a first dummy gate electrode formed on the first dummy gate insulating film,
the first active region, the second active region, and the first dummy active region are surrounded by the element isolation region formed in the semiconductor substrate,
the first active region is formed in a second conductivity type first well region,
the second active region is formed in a first conductivity type second well region, and
the first dummy active region is formed in a second conductivity type third well region.

2. The semiconductor device of claim 1, wherein an entire portion of the first dummy gate insulating film is free of the adjusting metal.

3. The semiconductor device of claim 2, further comprising:
a second dummy element formed on a second dummy active region of the semiconductor substrate, wherein the second dummy element includes:

a second dummy gate insulating film which includes a second dummy high dielectric constant insulating film formed on the second dummy active region, and
a second dummy gate electrode formed on the second dummy gate insulating film, and
the second dummy gate insulating film includes an adjusting-metal-containing portion which contains the adjusting metal and an adjusting-metal-free portion which is free of the adjusting metal.

4. The semiconductor device of claim 1, wherein the first dummy gate insulating film includes an adjusting-metal-containing portion which contains the adjusting metal and an adjusting-metal-free portion which is free of the adjusting metal.

5. The semiconductor device of claim 1, wherein the first dummy gate insulating film and the first dummy gate electrode are formed to extend on both the element isolation region and the first dummy active region.

6. The semiconductor device of claim 1, wherein the first dummy active region has a width of 0.2-10 µm in a gate length direction.

7. The semiconductor device of claim 1, wherein the first dummy active region has a width of 0.4-10 µm in a gate width direction.

8. The semiconductor device of claim 1, further comprising:
a second dummy active region of the semiconductor substrate adjacent to the first dummy active region in a gate length direction, wherein
an interval between the first dummy active region and the second dummy active region is 0.2-5 µm.

9. The semiconductor device of claim 1, further comprising:
a second dummy active region of the semiconductor substrate adjacent to the first dummy active region in a gate width direction, wherein
an interval between the first dummy active region and the second dummy active region is 0.4-10 µm.

10. The semiconductor device of claim 1, wherein the first dummy gate insulating film includes a first dummy underlying film formed between the first dummy active region and the first dummy high dielectric constant insulating film.

11. The semiconductor device of claim 1, wherein the first dummy high dielectric constant insulating film is made of metal oxide having a relative dielectric constant of 10 or higher.

12. The semiconductor device of claim 1, wherein the first dummy gate electrode includes a first dummy metal film formed on the first dummy gate insulating film and a first dummy silicon film formed on the first dummy metal film.

13. The semiconductor device of claim 1, wherein:
the first MIS transistor is an n-type MIS transistor,
the second MIS transistor is a p-type MIS transistor, and
the adjusting metal is lanthanum.

14. The semiconductor device of claim 1, wherein:
the first MIS transistor is a p-type MIS transistor,
the second MIS transistor is an n-type MIS transistor, and
the adjusting metal is aluminum.

15. The semiconductor device of claim 1, further comprising:
a second dummy element formed on a second dummy active region of the semiconductor substrate, wherein:
the second dummy element includes:
a second dummy gate insulating film which includes a second dummy high dielectric constant insulating film formed on the second dummy active region, and a second dummy gate electrode formed on the second dummy gate insulating film, and an entire portion of the second dummy high dielectric constant insulating film contains the adjusting metal.

* * * * *